(12) United States Patent
Ogata et al.

(10) Patent No.: US 10,982,347 B2
(45) Date of Patent: *Apr. 20, 2021

(54) LEAK CHECKING METHOD, LEAK CHECKING APPARATUS, ELECTROPLATING METHOD, AND ELECTROPLATING APPARATUS

(71) Applicant: EBARA CORPORATION, Tokyo (JP)

(72) Inventors: Shoichiro Ogata, Tokyo (JP); Masaaki Kimura, Tokyo (JP); Mitsutoshi Yahagi, Tokyo (JP)

(73) Assignee: EBARA CORPORATION, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 16/576,251

(22) Filed: Sep. 19, 2019

(65) Prior Publication Data

US 2020/0010972 A1  Jan. 9, 2020

Related U.S. Application Data

(62) Division of application No. 15/808,466, filed on Nov. 9, 2017, now Pat. No. 10,458,036.

(30) Foreign Application Priority Data

Nov. 14, 2016 (JP) .............................. JP2016-221906

(51) Int. Cl.
*C25D 17/06* (2006.01)
*C25D 5/34* (2006.01)
(Continued)

(52) U.S. Cl.
CPC ............... *C25D 17/06* (2013.01); *C25D 5/34* (2013.01); *C25D 7/12* (2013.01); *C25D 17/001* (2013.01); *C25D 17/004* (2013.01); *C25D 21/04* (2013.01); *G01M 3/3209* (2013.01); *G01M 3/3263* (2013.01); *G01M 3/3281* (2013.01);
(Continued)

(58) Field of Classification Search
None
See application file for complete search history.

(56) References Cited

U.S. PATENT DOCUMENTS

2013/0255360 A1  10/2013  Minami et al.

FOREIGN PATENT DOCUMENTS

JP  H11-271165 A  10/1999
JP  2003-277995 A  10/2003
(Continued)

*Primary Examiner* — Brian W Cohen
(74) *Attorney, Agent, or Firm* — BakerHostetler

(57) ABSTRACT

There is disclosed an improved leak checking method which can accurately test a sealing performance of a substrate holder more than conventional leak check techniques. The leak checking method includes: holding a substrate with a substrate holder, the substrate holder including a first holding member and a second holding member, the second holding member having an opening through which a surface of the substrate is exposed; pressing a sealing projection of the second holding member against the surface of the substrate when holding the substrate with the substrate holder; covering the surface of the substrate, exposed through the opening, and the sealing projection with a sealing cap; forming a hermetic space between the sealing cap and the substrate holder; introducing a pressurized gas into the hermetic space; and detecting a decrease in pressure of the pressurized gas in the hermetic space.

5 Claims, 22 Drawing Sheets

(51) Int. Cl.
*C25D 17/00* (2006.01)
*C25D 21/04* (2006.01)
*H01L 21/67* (2006.01)
*G01M 3/32* (2006.01)
*C25D 7/12* (2006.01)
*H01L 21/288* (2006.01)
*H01L 21/687* (2006.01)
*C25D 17/02* (2006.01)
*C25D 21/06* (2006.01)
*C25D 21/10* (2006.01)
*C25D 21/12* (2006.01)

(52) U.S. Cl.
CPC .... *H01L 21/2885* (2013.01); *H01L 21/67126* (2013.01); *H01L 21/68721* (2013.01); *C25D 17/02* (2013.01); *C25D 21/06* (2013.01); *C25D 21/10* (2013.01); *C25D 21/12* (2013.01)

(56) References Cited

FOREIGN PATENT DOCUMENTS

| | | |
|---|---|---|
| JP | 2013-204057 A | 10/2013 |
| JP | 2015-063761 A | 4/2015 |

LEAK CHECKING METHOD, LEAK CHECKING APPARATUS, ELECTROPLATING METHOD, AND ELECTROPLATING APPARATUS

CROSS REFERENCE TO RELATED APPLICATION

This document claims priority to U.S. Non-Provisional patent application U.S. Ser. No. 15/808,466, filed Nov. 9, 2017 and to Japanese Patent Application No. 2016-221906 filed Nov. 14, 2016, the entire contents of which are hereby incorporated by reference.

BACKGROUND

An electroplating apparatus for plating a substrate, such as a wafer, uses a substrate holder for detachably holding the substrate. The substrate held by the substrate holder is immersed in a plating solution. When a voltage is applied between an anode and the substrate, electric current flows from the anode to the substrate through the plating solution, whereby a surface of the substrate is plated in the presence of the plating solution.

The substrate holder for use in electroplating has an electrical contact which contacts the to-be-plated surface of the substrate. The substrate holder has a sealing function to prevent intrusion of the plating solution so that during plating of the substrate, the plating solution does not come into contact with the electrical contact of the substrate holder which is immersed in the plating solution. When the substrate holder holds the substrate, a hermetic space is formed in the interior of the substrate holder, and the electrical contact is located in this hermetic space.

If the sealing performance of the substrate holder is lowered, the plating solution may intrude into the hermetic space in the substrate holder and come into contact with the electrical contact. There are several techniques for testing a sealing performance of such a substrate holder, as disclosed in Japanese Laid-open Patent Publication No. 2003-277995 and Japan Patent No. 5782398.

SUMMARY OF THE INVENTION

According an embodiment, there is provided an improved leak checking apparatus and an improved leak checking method which can accurately test a sealing performance of a substrate holder more than conventional leak check techniques.

According an embodiment, there is provided an electroplating apparatus and an electroplating method including such a leak checking apparatus and such a leak checking method, respectively.

Embodiments, which will be described below, relate to a leak checking method and a leak checking apparatus for testing a sealing performance of a substrate holder for holding a substrate, such as a wafer. The below-described embodiments also relate to an electroplating method and an electroplating apparatus including such a leak checking method and such a leak checking apparatus, respectively.

In an embodiment, there is provided a leak checking method comprising: holding a substrate with a substrate holder, the substrate holder including a first holding member and a second holding member, the second holding member having an opening through which a surface of the substrate is exposed; pressing a sealing projection of the second holding member against the surface of the substrate when holding the substrate with the substrate holder; covering the surface of the substrate, exposed through the opening, and the sealing projection with a sealing cap; forming a hermetic space between the sealing cap and the substrate holder; introducing a pressurized gas into the hermetic space; and detecting a decrease in pressure of the pressurized gas in the hermetic space.

In an embodiment, the leak checking method further comprises: selecting a pressure command value from a preset pressure range; sending the selected pressure command value to a pressure regulator; and regulating the pressure of the pressurized gas in the hermetic space with the pressure regulator based on the pressure command value.

In an embodiment, the pressure range includes a pressure of a plating solution which is expected to be applied to the sealing projection when the substrate, held by the substrate holder, is immersed in the plating solution.

In an embodiment, a lower limit of the pressure range is a value of a pressure of the plating solution which is expected to be applied to an uppermost portion of the sealing projection when the substrate, held by the substrate holder in a vertical position, is immersed in the plating solution.

In an embodiment, an upper limit of the pressure range is a value obtained by multiplying a factor by a value of a pressure of the plating solution which is expected to be applied to a lowermost portion of the sealing projection when the substrate, held by the substrate holder in a vertical position, is immersed in the plating solution.

In an embodiment, forming the hermetic space between the sealing cap and the substrate holder comprises pressing the sealing cap against the substrate holder to form a hermetic space between the sealing cap and the substrate holder.

In an embodiment, the leak checking method further comprises: pressing a partition seal of the sealing cap against the substrate holder to divide the hermetic space into a first hermetic space and a second hermetic space, wherein introducing the pressurized gas into the hermetic space comprises supplying the pressurized gas into either the first hermetic space or the second hermetic space, wherein the sealing projection comprises a first sealing projection, and the second holding member further includes a second sealing projection which contacts the first holding member, and wherein the first sealing projection and the second sealing projection face the first hermetic space and the second hermetic space, respectively.

In an embodiment, there is provided a leak checking method comprising: holding a substrate with a substrate holder, the substrate holder including a first holding member and a second holding member, the first holding member having a first opening and a back-side sealing projection, the second holding member having a second opening and a front-side sealing projection; pressing the front-side sealing projection and the back-side sealing projection against a front surface and a back surface, respectively, of the substrate when holding the substrate with the substrate holder; covering the front surface of the substrate, exposed through the second opening, and the front-side sealing projection with a front-side sealing cap; forming a front-side hermetic space between the front-side sealing cap and the substrate holder; covering the back surface of the substrate, exposed through the first opening, and the back-side sealing projection with a back-side sealing cap; forming a back-side hermetic space between the back-side sealing cap and the substrate holder; introducing a pressurized gas into the front-side hermetic space and/or the back-side hermetic space; and detecting a decrease in pressure of the pressurized gas in the front-side hermetic space and/or the back-side hermetic space.

In an embodiment, the leak checking method further comprises: selecting a pressure command value from a preset pressure range; sending the selected pressure command value to a pressure regulator; and regulating the pressure of the pressurized gas in the front-side hermetic space and/or the back-side hermetic space with the pressure regulator based on the pressure command value.

In an embodiment, the pressure range includes a pressure of a plating solution which is expected to be applied to the front-side sealing projection and the back-side sealing projection when the substrate, held by the substrate holder, is immersed in the plating solution.

In an embodiment, a lower limit of the pressure range is a value of a pressure of the plating solution which is expected to be applied to an uppermost portion of the front-side sealing projection or an uppermost portion of the back-side sealing projection when the substrate, held by the substrate holder in a vertical position, is immersed in the plating solution.

In an embodiment, an upper limit of the pressure range is a value obtained by multiplying a factor by a value of a pressure of the plating solution which is expected to be applied to a lowermost portion of the front-side sealing projection or a lowermost portion of the back-side sealing projection when the substrate, held by the substrate holder in a vertical position, is immersed in the plating solution.

In an embodiment, there is provided an electroplating method comprising: setting a substrate, to be plated, on a substrate holder in a substrate attachment and detachment section; performing the above-described leak checking method; immersing the substrate, held by the substrate holder, in a plating solution; and plating the substrate.

In an embodiment, the leak checking method is performed in the substrate attachment and detachment section.

In an embodiment, there is provided a leak checking apparatus for checking for leakage of a fluid through a sealing projection of a substrate holder when the sealing projection is being pressed against a surface of a substrate held by the substrate holder which includes a first holding member and a second holding member, the second holding member having the sealing projection and an opening through which a surface of the substrate is to be exposed, said apparatus comprising: a sealing cap having a shape that covers the opening and the sealing projection; a pressurized-gas supply system configured to introduce a pressurized gas into a hermetic space formed between the sealing cap and the substrate holder; and a pressure decrease detector configured to detect a decrease in pressure of the pressurized gas in the hermetic space.

In an embodiment, the leak checking apparatus further comprises: a pressure regulator configured to regulate the pressure of the pressurized gas based on a pressure command value; and an operation controller that stores a preset pressure range therein, wherein the operation controller is configured to send the pressure command value, which has been selected from the pressure range, to the pressure regulator.

In an embodiment, there is provided an electroplating apparatus comprising: a substrate attachment and detachment section configured to set a substrate, to be plated, on a substrate holder; a plating tank configured to hold a plating solution therein; and the above-described leak checking apparatus.

In an embodiment, the leak checking apparatus is incorporated in the substrate attachment and detachment section.

In an embodiment, there is provided a leak checking apparatus for checking for leakage of a fluid through a front-side sealing projection and a back-side sealing projection of a substrate holder when the front-side sealing projection and the back-side sealing projection are being pressed against a front surface and a back surface, respectively, of a substrate held by the substrate holder which includes a first holding member and a second holding member, the first holding member having a first opening and the back-side sealing projection, the second holding member having a second opening and the front-side sealing projection, said apparatus comprising: a front-side sealing cap having a shape that covers the second opening and the front-side sealing projection; a back-side sealing cap having a shape that covers the first opening and the back-side sealing projection; a pressurized-gas supply system configured to introduce a pressurized gas into a front-side hermetic space formed between the front-side sealing cap and the substrate holder, and into a back-side hermetic space formed between the back-side sealing cap and the substrate holder; and a pressure decrease detector configured to detect a decrease in pressure of the pressurized gas in the front-side hermetic space and the back-side hermetic space.

In an embodiment, the leak checking apparatus further comprises: a pressure regulator configured to regulate the pressure of the pressurized gas based on a pressure command value; and an operation controller that stores a preset pressure range, wherein the operation controller is configured to send the pressure command value, which has been selected from the pressure range, to the pressure regulator.

In an embodiment, there is provided an electroplating apparatus comprising: a substrate attachment and detachment section configured to set a substrate, to be plated, on a substrate holder; a plating tank configured to hold a plating solution therein; and the above-described leak checking apparatus.

In an embodiment, the leak checking apparatus is incorporated in the substrate attachment and detachment section.

The leak check is performed in the presence of the pressurized gas in the hermetic space. During the leak check, the pressure of the pressurized gas is applied to a substrate such that the substrate is pressed in a direction away from the sealing projection. Also during plating of the substrate, the pressure of the plating solution is applied to the substrate such that the substrate is pressed in a direction away from the sealing projection. Thus, the leak check using the pressurized gas is performed under conditions similar to conditions under which the substrate is immersed in the plating solution. Therefore, the leak check according to the above-described embodiments can check the sealing performance of the substrate holder more accurately than the conventional leak check using a vacuum pressure.

DESCRIPTION OF EMBODIMENTS

Embodiments will now be described with reference to the drawings.

Figure 1:
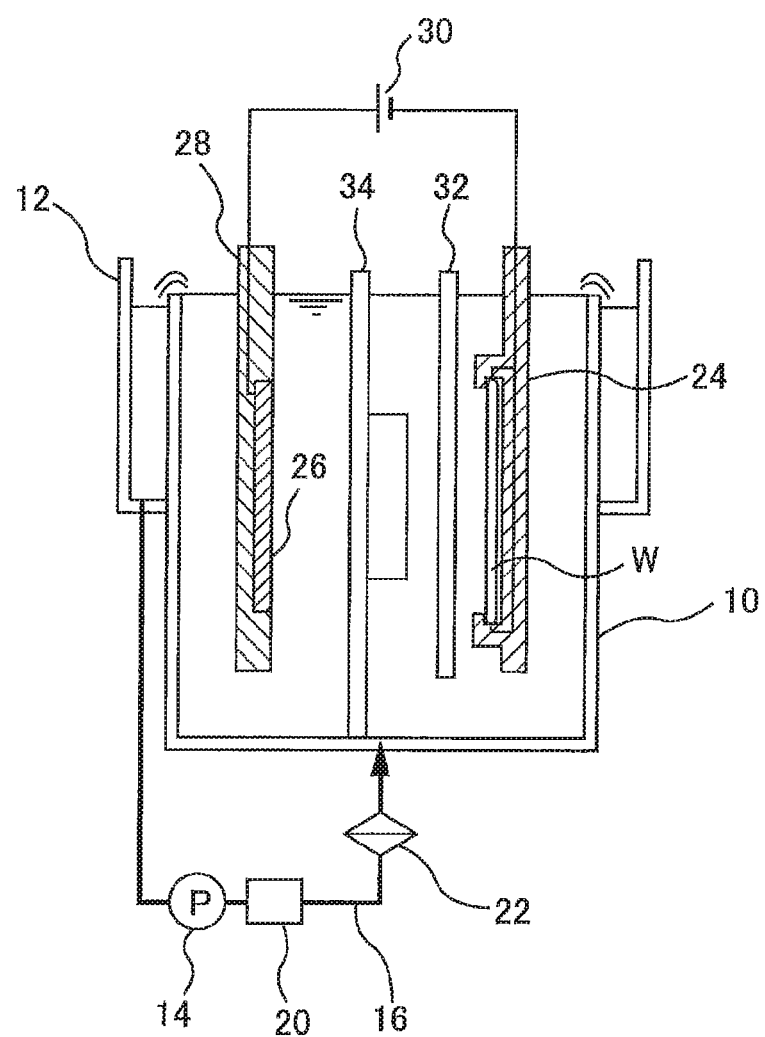
FIG. 1 is a vertical cross-sectional front view showing an embodiment of a plating tank provided in an electroplating apparatus.

FIG. 1 is a vertical cross-sectional front view of an embodiment of a plating tank provided in an electroplating apparatus. As shown in FIG. 1, a plating solution is held in the plating tank 10. An overflow tank 12 for receiving the plating solution that has overflowed a top edge of the plating tank 10 is provided adjacent to the plating tank 10.

One end of a plating-solution circulation line 16, which is provided with a pump 14, is coupled to a bottom of the overflow tank 12, while other end of the plating-solution circulation line 16 is coupled to a bottom of the plating tank 10. The plating solution that has accumulated in the overflow tank 12 is returned through the plating-solution circulation line 16 to the plating tank 10 by the actuation of the pump 14. A temperature control unit 20 for controlling the temperature of the plating solution, and a filter 22 for removing foreign matter from the plating solution, both located downstream of the pump 14, are attached to the plating-solution circulation line 16.

The electroplating apparatus includes a substrate holder 24 for detachably holding a substrate (which is an object to be plated) W, such as a wafer, and immersing the substrate W in a vertical state in the plating solution held in the plating tank 10. The electroplating apparatus further includes an anode 26 disposed in the plating tank 10, and an anode holder 28 holding the anode 26. When the substrate holder 24, holding the substrate W, is set in the plating tank 10, the substrate W and the anode 26 face each other in the plating tank 10. The substrate W has a surface conductive layer (e.g. a seed layer) formed therein in advance. The anode 26 is electrically connected to a positive pole of a power source 30, and the conductive layer of the substrate W is connected via the substrate holder 24 to a negative pole of the power source 30. When the power source 30 applies a voltage between the anode 26 and the substrate W, plating of the substrate W progresses in the presence of the plating solution, thus depositing a metal (e.g. copper) on the surface of the substrate W.

A paddle 32, which is configured to reciprocate parallel to the surface of the substrate W to agitate the plating solution, is disposed between the substrate holder 24 and the anode 26. By agitating the plating solution with the paddle 32, a sufficient amount of metal ions can be supplied uniformly to the surface of the substrate W. A regulation plate 34 made of a dielectric material is disposed between the paddle 32 and the anode 26 for making distribution of electric potential more uniform over the entire surface of the substrate W.

Figure 2:
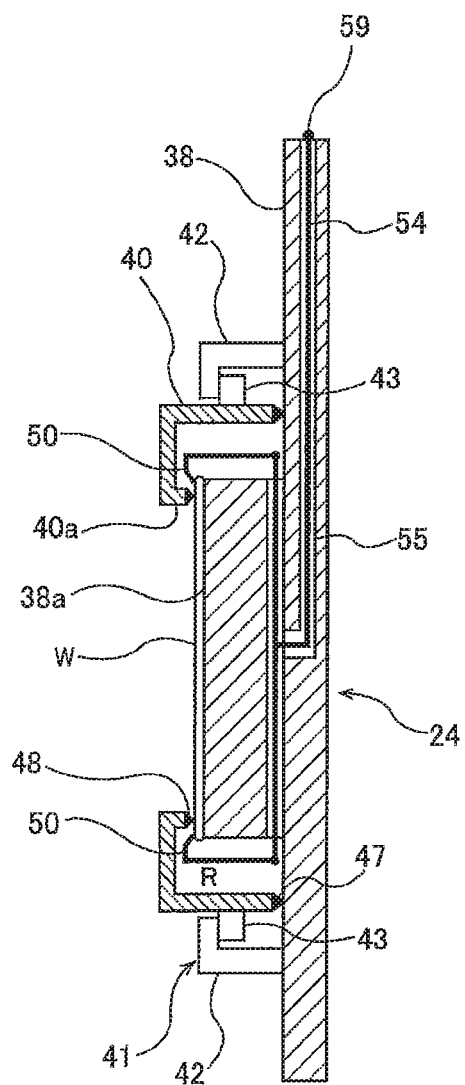
FIG. 2 is a schematic cross-sectional view showing a substrate holder.

FIG. 2 is a schematic cross-sectional view showing the substrate holder 24. The substrate holder 24 is adapted to be used in the electroplating apparatus for electroplating the substrate W such as a wafer. As shown in FIG. 2, the substrate holder 24 includes a first holding member 38 and a second holding member 40 for holding the substrate W. The second holding member 40 is secured to the first holding member 38 by a coupling mechanism 41.

The coupling mechanism 41 includes a first coupling member 42 secured to the first holding member 38, and a second coupling member 43 secured to the second holding member 40. The second coupling member 43 is mounted to an outer surface of the second holding member 40. The first coupling member 42 and the second coupling member 43 are configured to be engageable with each other. When the first coupling member 42 and the second coupling member 43 are engaged with each other, the second holding member 40 is secured to the first holding member 38. The second holding member 40 can be detached from the first holding member 38 by disengaging the first coupling member 42 and the second coupling member 43.

The first holding member 38 has a substrate support surface 38a for supporting a back surface of the substrate W. The substrate W is placed on the substrate support surface 38a. The second holding member 40 has an opening 40a which is smaller than a front surface of the substrate W. In this embodiment, the opening 40a has a circular shape, and its diameter is smaller than the diameter of the substrate W. When the substrate W is held by the substrate holder 24, the front surface of the substrate W is exposed through the opening 40a. The front surface of the substrate W is a surface to be plated.

The second holding member 40 has a first sealing projection 48 and a second sealing projection 47, each having an endless shape. The first sealing projection 48 and the second sealing projection 47 may each be a sealing member such as an O-ring. In an embodiment, the second holding member 40 itself, including the first sealing projection 48 and the second sealing projection 47, may be formed of a material having a sealing function. In this embodiment, the first sealing projection 48 and the second sealing projection 47 each have an annular shape and are arranged concentrically. The second sealing projection 47 is located radially outwardly of the first sealing projection 48. The size (diameter) of the second sealing projection 47 is larger than the size (diameter) of the first sealing projection 48. In a case of a face-down type plating apparatus in which a substrate holder, holding a substrate with its to-be-plated surface facing downward, is disposed horizontally in a plating tank, the second sealing projection 47 may be omitted.

When the second holding member 40 is secured to the first holding member 38 by the coupling mechanism 41 with the back surface of the substrate W supported on the substrate support surface 38a, the first sealing projection 48 is pressed against a peripheral portion of the front surface (to-be-plated surface) of the substrate W, and the second sealing projection 47 is pressed against the first holding member 38. The first sealing projection 48 seals a gap between the second holding member 40 and the front surface of the substrate W, and the second sealing projection 47 seals a gap between the first holding member 38 and the second holding member 40. Consequently, an internal space R is formed in the substrate holder 24.

The internal space R is formed by the first holding member 38, the second holding member 40 and the substrate W. The substrate holder 24 has a plurality of electrical contacts 50 disposed in the internal space R. The electrical contacts 50 are disposed such that they contact the peripheral portion of the substrate W when the substrate W is held by the substrate holder 24. The electrical contacts 50 are connected to a plurality of electrical wires 54 extending in the interior of the first holding member 38. The electrical wires 54 are disposed in a wire passage 55 formed in the first holding member 38. One ends of the electrical wires 54 are connected to the electrical contacts 50, while the other ends of the electrical wires 54 are connected to an external terminal 59 secured to the first holding member 38. When the substrate holder 24 is set in the plating tank 10 shown in FIG. 1, the external terminal 59 is electrically connected to the power source 30 shown in FIG. 1.

One end of the wire passage 55 opens in a peripheral surface of the first holding member 38, while the other end of the wire passage 55 communicates with the internal space R. The internal space R communicates with the atmosphere through the wire passage 55. Accordingly, the atmospheric pressure is produced in the internal space R.

Figure 3:
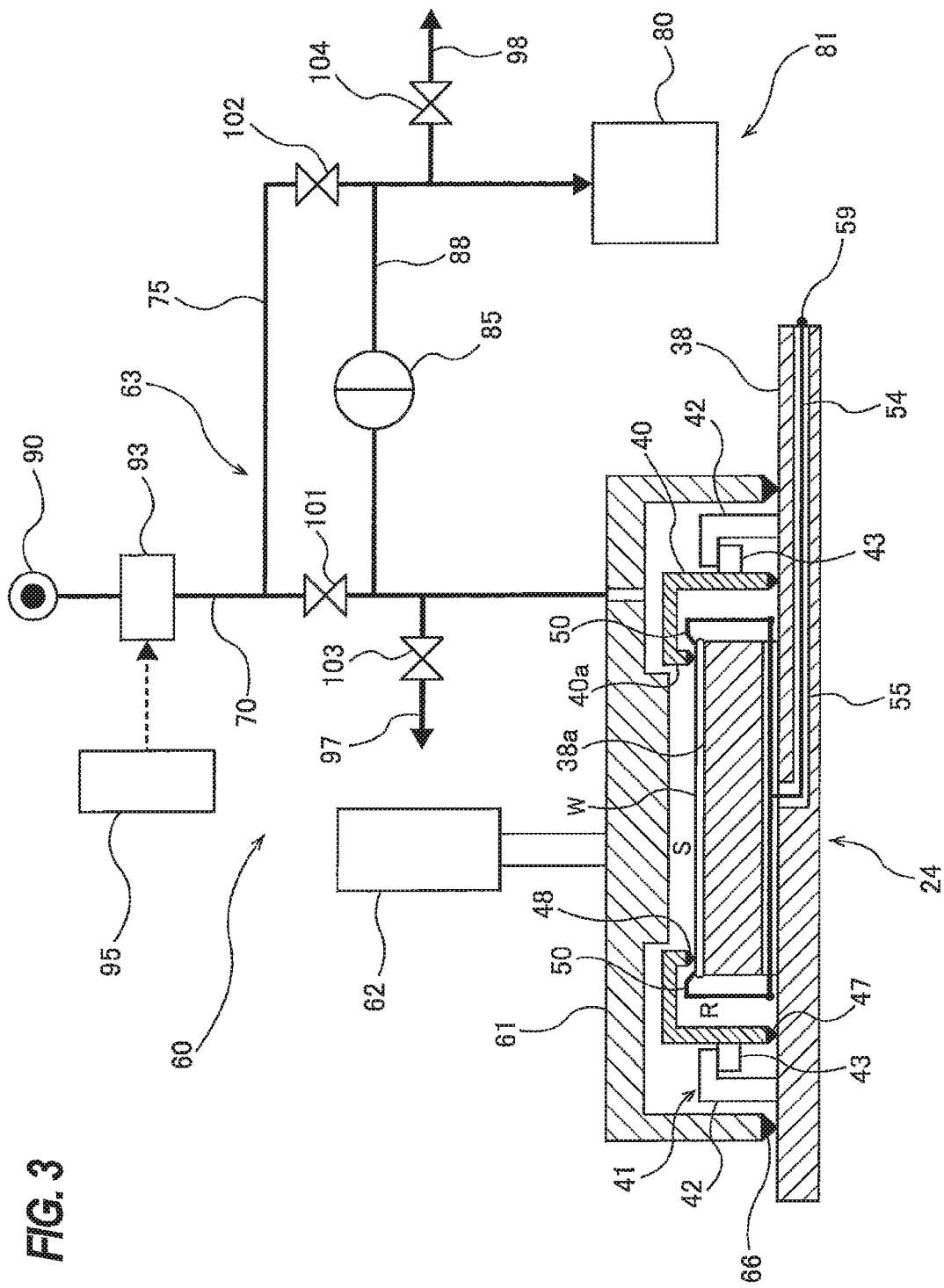
FIG. 3 is a schematic view showing an embodiment of a leak checking apparatus for testing sealing performances of a first sealing projection and a second sealing projection of the substrate holder.

FIG. 3 is a schematic view showing an embodiment of a leak checking apparatus 60 for testing the sealing performances of the first sealing projection 48 and the second sealing projection 47 of the substrate holder 24. The test of the sealing performances of the first sealing projection 48 and the second sealing projection 47 is performed by checking whether a pressurized gas leaks through the sealing projections 47, 48. This leak check is performed when the substrate holder 24 is holding the substrate W.

As shown in FIG. 3, the leak checking apparatus 60 includes a sealing cap 61 having a shape that covers the second holding member 40 of the substrate holder 24, a pressing mechanism 62 for pressing the sealing cap 61 against the first holding member 38 of the substrate holder 24, and a pressurized-gas supply system 63 coupled to the sealing cap 61. The pressing mechanism 62 may be, for example, an air cylinder or an electric actuator. The sealing cap 61 is a rigid body which does not permit passage of a gas, and has a larger size than an assembly of the substrate W and the second holding member 40. The sealing cap 61 has a shape that covers the opening 40a of the second holding member 40, the first sealing projection 48, and the second sealing projection 47. The sealing cap 61 has an endless gas seal 66 secured to an open end of the sealing cap 61. In this embodiment the gas seal 66 has an annular shape.

The sealing cap 61 is pressed against the substrate holder 24 by the pressing mechanism 62 with the gas seal 66 in contact with the first holding member 38 of the substrate holder 24. The gas seal 66 is pressed against the first holding member 38 of the substrate holder 24 to seal a gap between the sealing cap 61 and the first holding member 38, thereby forming a hermetic space S between the sealing cap 61 and the substrate holder 24. The hermetic space S is formed by the sealing cap 61, the first holding member 38 and the second holding member 40 of the substrate holder 24, and the front surface of the substrate W that is exposed through the opening 40a of the second holding member 40. The front surface of the substrate W, exposed through the opening 40a of the second holding member 40, the first sealing projection 48, and the second sealing projection 47 are covered by the sealing cap 61.

The pressurized-gas supply system 63 includes a pressurized-gas introduction line 70 coupled to the sealing cap 61, a differential-pressure check line 75 branching off from the pressurized-gas introduction line 70, and a bridge line 88 coupled to both the pressurized-gas introduction line 70 and the differential-pressure check line 75. The leak checking apparatus 60 includes a master container 80 coupled to the differential-pressure check line 75, and a differential-pressure measuring device 85 for measuring a pressure difference between the pressurized gas in the hermetic space S and the pressurized gas in the master container 80. The master container 80 is a container in which no gas leak is guaranteed. The differential-pressure measuring device 85 is attached to the bridge line 88, and communicates with both the hermetic space S and the master container 80. One end of the differential-pressure measuring device 85 is coupled to the pressurized-gas introduction line 70 through the bridge line 88, while the other end of the differential-pressure measuring device 85 is coupled to the master container 80 through the bridge line 88 and the differential-pressure check line 75.

One end of the pressurized-gas introduction line 70 is coupled to a pressurized-gas supply source 90, while the other end of the pressurized-gas introduction line 70 communicates with the hermetic space S formed between the sealing cap 61 and the substrate holder 24. Therefore, the pressurized gas is supplied into the hermetic space S through the pressurized-gas introduction line 70. Further, the pressurized gas is supplied into the master container 80 through the pressurized-gas introduction line 70 and the differential-pressure check line 75. Examples of the pressurized gas may include nitrogen gas, helium gas, argon gas and carbon dioxide gas.

The pressurized-gas introduction line 70 is provided with a pressure regulator 93. The operation of the pressure regulator 93 is controlled by an operation controller 95. The pressure regulator 93 is a device capable of regulating the pressure of the pressurized gas in the pressurized-gas introduction line 70 based on a pressure command value sent from the operation controller 95. An electropneumatic regulator can be used as the pressure regulator 93. The pressure regulator 93 has a pressure sensor (not shown) for measuring the pressure of the pressurized gas in the pressurized-gas introduction line 70. The operation controller 95 sends the pressure command value to the pressure regulator 93, and the pressure regulator 93 operates to maintain the pressurized gas in the pressurized-gas introduction line 70 at a pressure corresponding to the pressure command value.

A holder-side exhaust line 97 and a master-side exhaust line 98 are coupled to the pressurized-gas introduction line 70 and the differential-pressure check line 75, respectively. The pressurized-gas supply system 63 has a holder-side valve 101 attached to the pressurized-gas introduction line 70, a master-side valve 102 attached to the differential-pressure check line 75, a first vent valve 103 attached to the holder-side exhaust line 97, and a second vent valve 104 attached to the master-side exhaust line 98. The holder-side valve 101 and the master-side valve 102 are located upstream of the bridge line 88. The holder-side exhaust line 97, the first vent valve 103, the master-side exhaust line 98 and the second vent valve 104 are located downstream of the bridge line 88. The operations of the holder-side valve 101, the master-side valve 102, the first vent valve 103 and the second vent valve 104 are controlled by the operation controller 95.

When the operation controller 95 opens the holder-side valve 101 and the master-side valve 102 while keeping the first vent valve 103 and the second vent valve 104 closed, the pressurized gas flows through the pressurized-gas introduction line 70 and the differential-pressure check line 75, and is introduced into the hermetic space S and the master container 80. The pressure of the pressurized gas in the hermetic space S and that in the master container 80 are regulated by the pressure regulator 93, and the operation of the pressure regulator 93 is controlled by the operation controller 95.

When the holder-side valve 101 and the master-side valve 102 are closed, the hermetic space S and the master container 80 are sealed, so that the pressurized gas is confined in the hermetic space S and in the master container 80. The pressure of the pressurized gas in the sealed hermetic space S is equal to the pressure of the pressurized gas in the sealed master container 80. However, if the sealing performance of the first sealing projection 48 and/or the second sealing projection 47 has deteriorated, the pressurized gas in the hermetic space S leaks into the internal space R of the substrate holder 24 through the first sealing projection 48 and/or the second sealing projection 47. Consequently, the pressure in the hermetic space S decreases.

Therefore, in order to check the leakage of the pressurized gas from the hermetic space S, the leak checking apparatus 60 includes a pressure decrease detector 81 for detecting a decrease in the pressure of the pressurized gas in the hermetic space S. More specifically, the pressure decrease detector 81 measures a decrease in the pressure of the pressurized gas in the sealed hermetic space S, and determines whether the decrease in the pressure has exceeded a threshold value within a set time. In this embodiment, the pressure decrease detector 81 includes at least the master container 80 and the differential-pressure measuring device 85. The pressure in the master container 80, which is a container in which no gas leak is guaranteed, does not decrease over time.

The differential-pressure measuring device 85 is configured to measure a pressure difference between the pressurized gas in the hermetic space S and the pressurized gas in the master container 80. This pressure difference corresponds to the decrease in the pressure of the pressurized gas in the hermetic space S. Further, the differential-pressure measuring device 85 compares the pressure difference to the threshold value, and determines whether the pressure difference has exceeded the threshold value within the set time. The differential-pressure measuring device 85 is configured to emit a signal indicating that there is no leakage of the pressurized gas (i.e. the first sealing projection 48 and the second sealing projection 47 are functioning properly) if the pressure difference has not exceeded the threshold value within the set time, and to emit a signal indicating that there is leakage of the pressurized gas (i.e. there is a failure of the first sealing projection 48 and/or the second sealing projection 47) if the pressure difference has exceeded the threshold value within the set time. The set time may be in the range of 1 second to 30 seconds, preferably in the range of 2 to 10 seconds. In an embodiment, the pressure decrease detector 81 may measure the pressure of the pressurized gas in the hermetic space S with a pressure sensor (not shown), and detect whether the measured pressure has become lower than a threshold value within a set time.

According to this embodiment, the pressure of the pressurized gas is applied to the substrate W and the substrate holder 24 during the leak check operation. During plating of the substrate W, the pressure of the plating solution is applied to the substrate W and the substrate holder 24 as well. In particular, the substrate W is pressed by the plating solution in a direction away from the first sealing projection 48. The leak check using the pressurized gas is performed under conditions similar to conditions under which the substrate W is immersed in the plating solution. Therefore, the leak check according to this embodiment can check the sealing performances of the first sealing projection 48 and the second sealing projection 47 more accurately than conventional leak check using vacuum pressure.

In order to perform the leak check under the conditions similar to the conditions under which the substrate W is immersed in the plating solution, the pressure of the pressurized gas may preferably be equal to the pressure of the plating solution applied to the first sealing projection 48 and the second sealing projection 47 during plating of the substrate W. The pressure of the pressurized gas is determined in advance from this viewpoint, and the operation controller 95 controls the operation of the pressure regulator 93 so that the pressurized gas has the determined pressure.

As shown in FIG. 1, the substrate holder 24 and the substrate W are immersed in a vertical position in the plating solution. Accordingly, there is a difference in the pressure of the plating solution between an upper portion and a lower portion of the substrate holder 24. In this embodiment, the lowest pressure of the plating solution acts on the uppermost portion of the second sealing projection 47, while the highest pressure of the plating solution acts on the lowermost portion of the second sealing projection 47. In a case where the diameter of the first sealing projection 48 is larger than the diameter of the second sealing projection 47, the lowest pressure of the plating solution acts on the uppermost portion of the first sealing projection 48, while the highest pressure of the plating solution acts on the lowermost portion of the first sealing projection 48.

In the following descriptions, the pressure of the plating solution applied to the uppermost portion of the second sealing projection 47 is referred to as pressure P1, and the pressure of the plating solution applied to the lowermost portion of the second sealing projection 47 is referred to as pressure P2. In an embodiment, the pressure P1 may be the pressure of the plating solution applied to the uppermost portion of the first sealing projection 48, and the pressure P2 may be the pressure of the plating solution applied to the lowermost portion of the first sealing projection 48.

The pressures P1, P2 depend on the size of the substrate holder 24, the diameter of the substrate W, the diameter of the second sealing projection 47 (or the first sealing projection 48), and a surface level of the plating solution held in the plating tank 10. The plating solution overflows the side wall of the plating tank 10 into the overflow tank 12; therefore, the surface level of the plating solution coincides with the position of the top of the side wall of the plating tank 10.

A pressure of the pressurized gas, to be used in the leak check, is determined based on the pressure P1 and the pressure P2 which can be applied from the plating solution to the second sealing projection 47 (or the first sealing projection 48) during plating of the substrate W. In an embodiment, the pressure of the pressurized gas is not less than the pressure P1 and not more than the pressure P2. The pressure of the pressurized gas may be higher than the pressure P2. A preset pressure range is pre-stored in the operation controller 95. The pressure range includes a pressure of the plating solution which is expected to be applied to the first sealing projection 48 and the second sealing projection 47 when the substrate W, held by the substrate holder 24, is immersed in the plating solution held in the plating tank 10. In an embodiment, the lower limit of the pressure range is the pressure P1, while the upper limit is a numerical value obtained by multiplying the value of the pressure P2 by a factor which is a predetermined value of not less than 1.

The operation controller 95 sends a pressure command value, which has been selected from the pressure range, to the pressure regulator 93, and the pressure regulator 93 operates to maintain the pressurized gas in the pressurized-gas introduction line 70 at a pressure corresponding to the pressure command value. In an embodiment, the pressure command value is the value of the pressure P2. In this case, the pressurized gas supplied to the hermetic space S has the pressure P2 which corresponds to the maximum pressure that can be applied from the plating solution to the second sealing projection 47. The leak check is thus performed under the realistic and unfavorable conditions. In other words, the substrate holder 24, having the first sealing projection 48 and the second sealing projection 47 that have passed the leak check, is highly reliable. Therefore, according to this embodiment, plating of the substrate W can be performed with the use of the highly reliable substrate holder 24.

A leak checking method performed by using the above-described leak checking apparatus 60 will now be described with reference to FIG. 4. First, the substrate W is interposed between the first holding member 38 and the second holding member 40 with the front surface of the substrate W exposed through the opening 40a of the second holding member 40, whereby the substrate W is held by the substrate holder 24 (step 1). When holding the substrate W with the substrate holder 24, the first sealing projection 48 of the second holding member 40 seals the gap between the peripheral portion of the front surface of the substrate W and the second holding member 40, and the second sealing projection 47 of the second holding member 40 seals the gap between the first holding member 38 and the second holding member 40, thereby forming the internal space R in the substrate holder 24 by the first holding member 38, the second holding member 40 and the substrate W.

Next, the sealing cap 61 is disposed on the first holding member 38 of the substrate holder 24 so as to cover the entireties of the front surface of the substrate W, exposed through the opening 40a, and the second holding member 40 (step 2). The gas seal 66 of the sealing cap 61 is pressed against the first holding member 38 by the pressing mechanism 62 to seal the gap between the first holding member 38 and the sealing cap 61, thereby forming the hermetic space S between the sealing cap 61 and the substrate holder 24 (step 3).

The operation controller 95 selects a pressure command value from the pressure range stored therein, and sends the pressure command value to the pressure regulator 93 (step 4). The operation controller 95 opens the holder-side valve 101 and the master-side valve 102 while keeping the first vent valve 103 and the second vent valve 104 closed. The pressurized gas flows through the pressurized-gas introduction line 70 and the differential-pressure check line 75 into the hermetic space S and the master container 80 (step 5). The pressure of the pressurized gas in the hermetic space S and in the master container 80 is regulated by the pressure regulator 93, and the operation of the pressure regulator 93 is controlled by the operation controller 95. More specifically, the pressure regulator 93 operates to maintain the pressurized gas in the pressurized-gas introduction line 70 at a pressure corresponding to the pressure command value.

When a predetermined amount of time has elapsed since the holder-side valve 101 and the master-side valve 102 were opened, the operation controller 95 closes the holder-side valve 101 and the master-side valve 102. The hermetic space S and the master container 80 are sealed by the holder-side valve 101 and the master-side valve 102, respectively. The hermetic space S and the master container 80 are each filled with the pressurized gas having the same pressure (step 6).

As described above, with the holder-side valve 101 and the master-side valve 102 closed, the differential-pressure measuring device 85 measures a pressure difference between the pressurized gas in the hermetic space S and the pressurized gas in the master container 80 (step 7). The differential-pressure measuring device 85 determines whether the pressure difference has exceeded the threshold value within the set time (step 8). If the pressure difference has not exceeded the threshold value within the set time, the differential-pressure measuring device 85 emits a signal indicating that there is no leakage of the pressurized gas in the hermetic space S (i.e. the first sealing projection 48 and the second sealing projection 47 are functioning properly) (step 9). If the pressure difference has exceeded the threshold value within the set time, the differential-pressure measuring device 85 emits a signal indicating that there is leakage of the pressurized gas in the hermetic space S (i.e. there is a failure of the first sealing projection 48 and/or the second sealing projection 47) (step 10).

The operation controller 95 opens the first vent valve 103 and the second vent valve 104, so that the pressurized gas in the hermetic space S and the pressurized gas in the master container 80 are discharged through the holder-side exhaust line 97 and the master-side exhaust line 98. The leak check is performed in this manner to test the sealing performances of the first sealing projection 48 and the second sealing projection 47.

In some cases, the leak check is performed on a substrate holder which has a substrate support surface 38a configured to contact the back side of a peripheral portion of a substrate W to support the substrate W. When the substrate W is held by the substrate holder, a space is formed on the back surface of the substrate W, and the space on the back surface communicates with the internal space R. If the pressurized gas is not supplied to the space on the back surface of the substrate W and is supplied only to the hermetic space S on the front surface of the substrate W in the leak check for the substrate holder, then there is a fear that the substrate W will warp. Therefore, it is preferred to supply the pressurized gas to the internal space R so that the pressure in the internal space R becomes higher than the atmospheric pressure and, in addition, becomes lower than or substantially equal to the pressure in the hermetic space S on the front surface of the substrate W. This can prevent or reduce warping of the substrate W upon the leak check.

Figure 5:
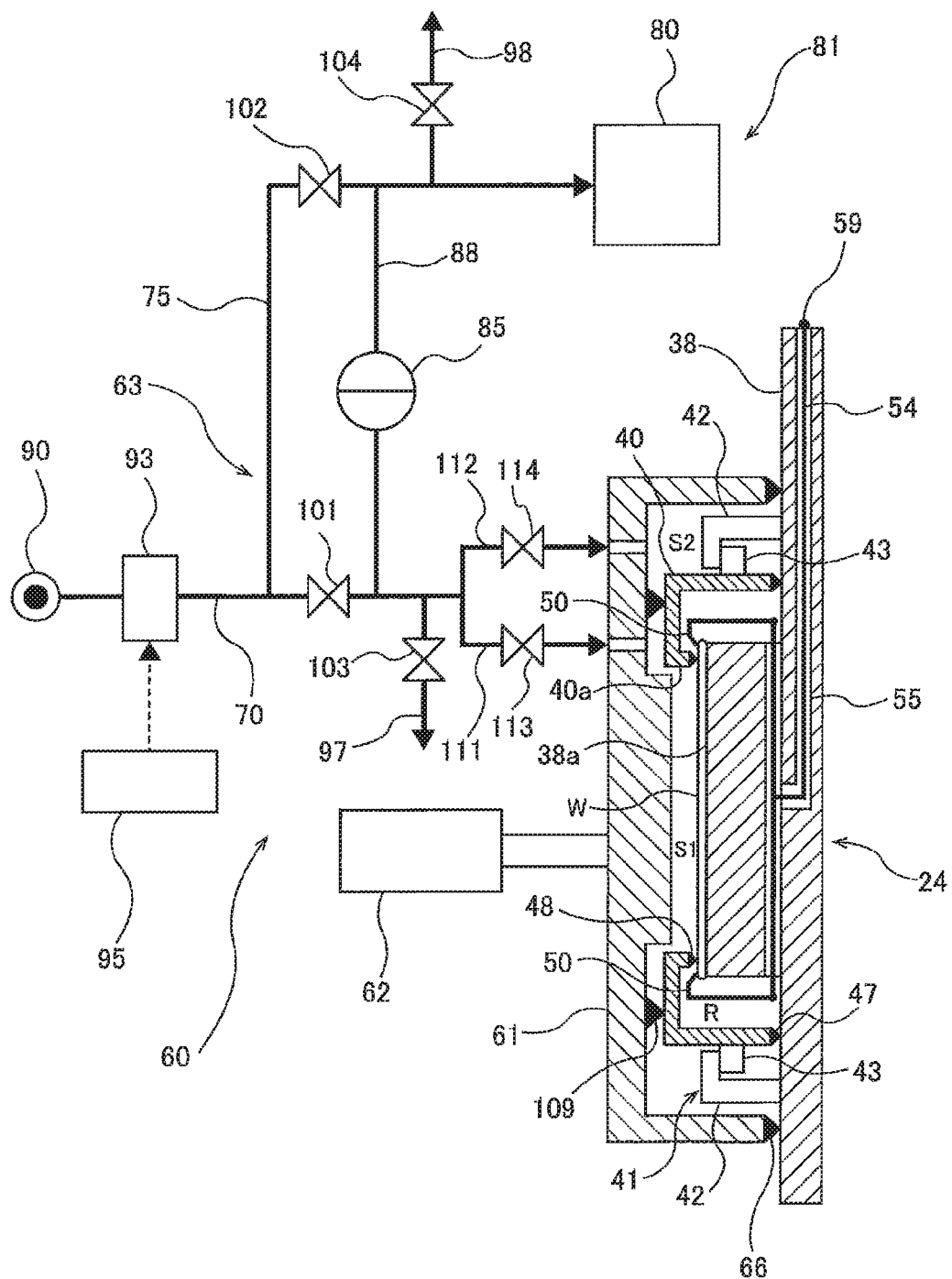
FIG. 5 is a schematic view showing another embodiment of a leak checking apparatus.

FIG. 5 is a schematic view showing another embodiment of a leak checking apparatus 60. The constructions of this embodiment, not particularly described here, are the same as the constructions of the embodiment described above with reference to FIG. 3, and duplicate descriptions thereof are omitted.

In this embodiment, the sealing cap 61 further has an endless partition seal 109 which contacts the second holding member 40 when the gas seal 66 contacts the first holding member 38 of the substrate holder 24. In this embodiment, as with the gas seal 66, the partition seal 109 has an annular shape. The partition seal 109 is disposed radially inwardly of the gas seal 66; the size (diameter) of the partition seal 109 is smaller than the size (diameter) of the gas seal 66. In this embodiment, the size (diameter) of the partition seal 109 is larger than that of the first sealing projection 48 and smaller than that of the second sealing projection 47.

When the pressing mechanism 62 presses the sealing cap 61 against the substrate holder 24, the gas seal 66 of the sealing cap 61 is pressed against the first holding member 38, and the partition seal 109 of the sealing cap 61 is pressed against the second holding member 40. Consequently, the hermetic space S, formed between the substrate holder 24 and the sealing cap 61, is divided by the partition seal 109 into a first hermetic space S1 and a second hermetic space S2. The first hermetic space S1 is located inside the second hermetic space S2.

The first hermetic space S1 is partly defined by the partition seal 109 and the first sealing projection 48, while the second hermetic space S2 is partly defined by the gas seal 66, the partition seal 109 and the second sealing projection 47. In other words, the first sealing projection 48 of the substrate holder 24 faces the first hermetic space S1, while the second sealing projection 47 of the substrate holder 24 faces the second hermetic space S2. Therefore, in the event of a failure of the first sealing projection 48, the pressurized gas in the first hermetic space S1 leaks into the internal space R. In the event of a failure of the second sealing projection 47, the pressurized gas in the second hermetic space S2 leaks into the internal space R.

The pressurized-gas introduction line 70 branches into a first branch line 111 and a second branch line 112. The first branch line 111 and the second branch line 112 are located downstream of the bridge line 88. Both of the two branch lines 111, 112 are coupled to the sealing cap 61. The first branch line 111 communicates with the first hermetic space S1, and the second branch line 112 communicates with the second hermetic space S2. The first branch line 111 is provided with a first branch valve 113, and the second branch line 112 is provided with a second branch valve 114. By opening either the first branch valve 113 or the second branch valve 114, the pressurized gas can be supplied selectively to the first hermetic space S1 or the second hermetic space S2. The operations of the first branch valve 113 and the second branch valve 114 are controlled by the operation controller 95. The operation controller 95 is configured to be capable of manipulating the first branch valve 113 and the second branch valve 114 independently of each other.

Figure 6:
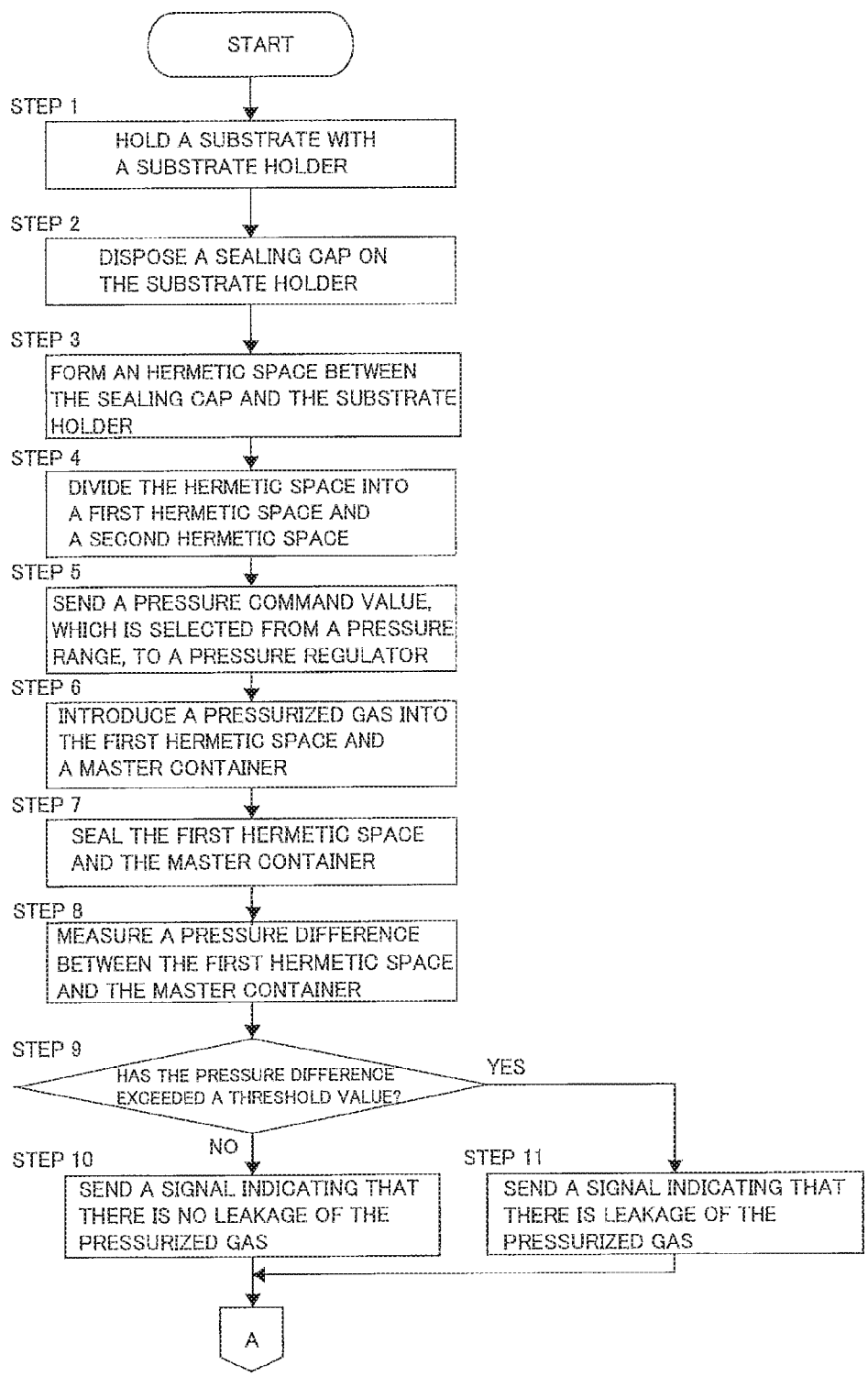
FIG. 6 is a part of a flow chart illustrating a leak checking method performed by using the leak checking apparatus shown in FIG. 5.
Figure 7:
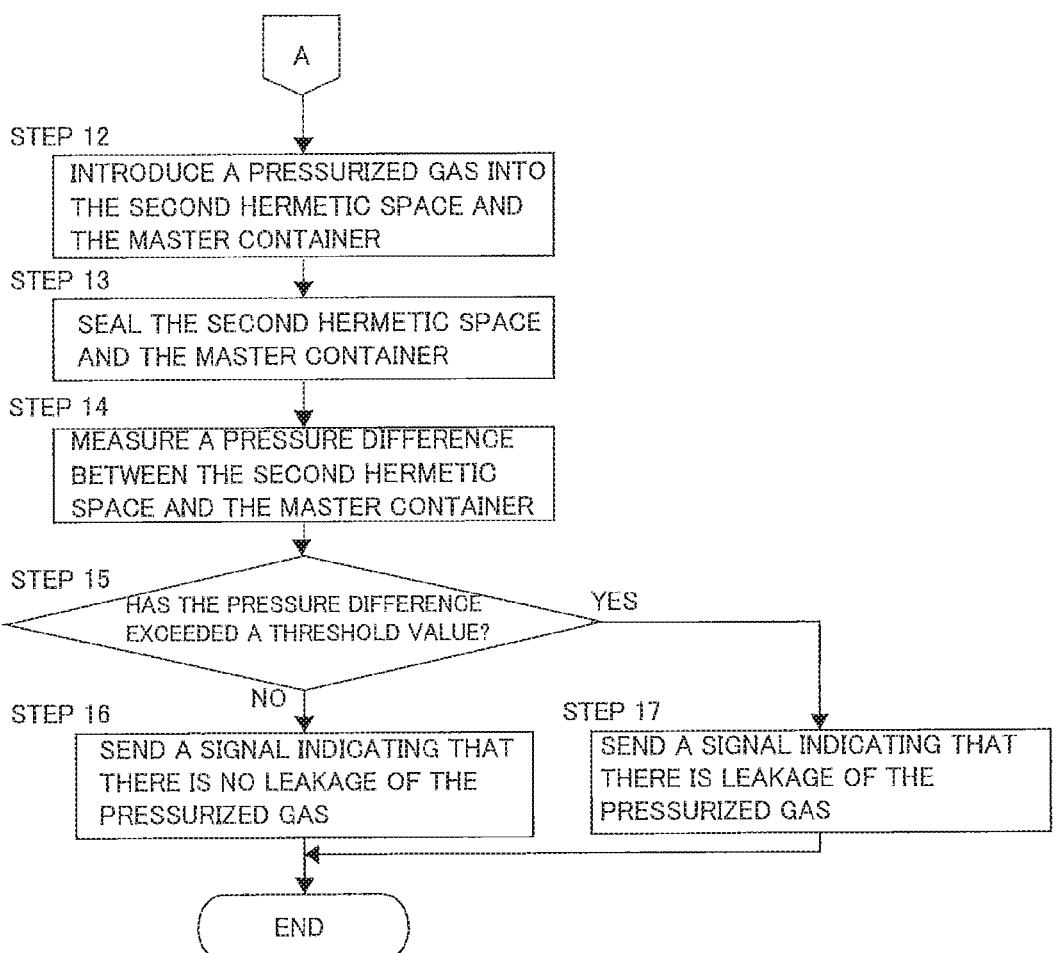
FIG. 7 is other part of the flow chart, following the part shown in FIG. 6.

An embodiment of a leak checking method, performed by using the leak checking apparatus 60 shown in FIG. 5, will now be described with reference to FIGS. 6 and 7. First, the substrate W is interposed between the first holding member 38 and the second holding member 40 with the front surface of the substrate W exposed through the opening 40a of the second holding member 40, whereby the substrate W is held by the substrate holder 24 (step 1). When holding the substrate W with the substrate holder 24, the first sealing projection 48 of the second holding member 40 seals the gap between the peripheral portion of the front surface of the substrate W and the second holding member 40, and the second sealing projection 47 of the second holding member 40 seals the gap between the first holding member 38 and the second holding member 40, thereby forming the internal space R in the substrate holder 24 by the first holding member 38, the second holding member 40 and the substrate W.

Next, the sealing cap 61 is disposed on the first holding member 38 of the substrate holder 24 so as to cover the entireties of the front surface of the substrate W, exposed through the opening 40a, and the second holding member 40 (step 2). The gas seal 66 of the sealing cap 61 is pressed against the first holding member 38 by the pressing mechanism 62 to seal the gap between the first holding member 38 and the sealing cap 61, thereby forming a hermetic space between the sealing cap 61 and the substrate holder 24 (step 3). At the same time, the partition seal 109 of the sealing cap 61 is pressed against the second holding member 40 by the pressing mechanism 62, whereby the hermetic space is divided by the partition seal 109 into the first hermetic space S1 and the second hermetic space S2 (step 4).

The operation controller 95 selects a pressure command value from the pressure range stored therein, and sends the pressure command value to the pressure regulator 93 (step 5). The operation controller 95 opens the holder-side valve 101, the master-side valve 102 and the first branch valve 113 while keeping the first vent valve 103, the second vent valve 104 and the second branch valve 114 closed. The pressurized gas flows through the pressurized-gas introduction line 70 and the differential-pressure check line 75 into the first hermetic space S1 and the master container 80 (step 6). The pressure regulator 93 operates to maintain the pressurized gas in the first hermetic space S1 and the pressurized gas in the master container 80 at a pressure corresponding to the pressure command value.

With the recent progress of three-dimensional packaging technology or WLP (Wafer Level Packaging) technology, electroplating of a thin-film substrate is being studied. Thus, the substrate W can be a thin-film substrate e.g. having a maximum thickness of 400 μm. In order to prevent such a substrate W from being warped or damaged by a fluid pressure applied to the substrate W when the pressurized gas is supplied to the first hermetic space S1, the first branch valve 113 for supplying the pressurized gas to the first hermetic space S1 is preferably located at a position which is not close to but distant from the substrate W. This enables the leak check to be performed on the substrate holder 24 even when it is holding such a thin-film substrate.

When a predetermined amount of time has elapsed since the holder-side valve 101, the master-side valve 102 and the first branch valve 113 were opened, the operation controller 95 closes the holder-side valve 101 and the master-side valve 102. The first hermetic space S1 and the master container 80 are sealed by the holder-side valve 101 and the master-side valve 102, respectively. The first hermetic space S1 and the master container 80 are each filled with the pressurized gas having the same pressure (step 7).

With the holder-side valve 101 and the master-side valve 102 closed, the differential-pressure measuring device 85 measures a pressure difference between the pressurized gas in the first hermetic space S1 and the pressurized gas in the master container 80 (step 8). The differential-pressure measuring device 85 determines whether the pressure difference has exceeded a threshold value within the set time (step 9). If the pressure difference has not exceeded the threshold value within the set time, the differential-pressure measuring device 85 emits a signal indicating that there is no leakage of the pressurized gas in the first hermetic space S1 (i.e. the first sealing projection 48 is functioning properly) (step 10). If the pressure difference has exceeded the threshold value within the set time, the differential-pressure measuring device 85 emits a signal indicating that there is leakage of the pressurized gas in the first hermetic space S1 (i.e. there is a failure of the first sealing projection 48) (step 11).

The operation controller 95 opens the first vent valve 103 and the second vent valve 104 to discharge the pressurized gas in the first hermetic space S1 and the pressurized gas in the master container 80 through the holder-side exhaust line 97 and the master-side exhaust line 98. The first leak check is performed in this manner to test the sealing performance of the first sealing projection 48.

Subsequently, the second leak check for testing the sealing performance of the second sealing projection 47 is performed in the following manner. The operation controller 95 opens the holder-side valve 101, the master-side valve 102 and the second branch valve 114 while keeping the first vent valve 103, the second vent valve 104 and the first branch valve 113 closed. The pressurized gas flows through the pressurized-gas introduction line 70 and the differential-pressure check line 75 into the second hermetic space S2 and the master container 80 (step 12, see FIG. 7). The pressure regulator 93 operates to maintain the pressurized gas in the second hermetic space S2 and the pressurized gas in the master container 80 at a pressure corresponding to the pressure command value.

When a predetermined amount of time has elapsed since the holder-side valve 101, the master-side valve 102 and the second branch valve 114 were opened, the operation controller 95 closes the holder-side valve 101 and the master-side valve 102. The second hermetic space S2 and the master container 80 are sealed by the holder-side valve 101 and the master-side valve 102, respectively. The second hermetic space S2 and the master container 80 are each filled with the pressurized gas having the same pressure (step 13).

With the holder-side valve 101 and the master-side valve 102 closed, the differential-pressure measuring device 85 measures a pressure difference between the pressurized gas in the second hermetic space S2 and the pressurized gas in the master container 80 (step 14). The differential-pressure measuring device 85 determines whether the pressure difference has exceeded a threshold value within the set time (step 15). If the pressure difference has not exceeded the threshold value within the set time, the differential-pressure measuring device 85 emits a signal indicating that there is no leakage of the pressurized gas in the second hermetic space S2 (i.e. the second sealing projection 47 is functioning properly) (step 16). If the pressure difference has exceeded the threshold value within the set time, the differential-pressure measuring device 85 emits a signal indicating that there is leakage of the pressurized gas in the second hermetic space S2 (i.e. there is a failure of the second sealing projection 47) (step 17).

The operation controller 95 opens the first vent valve 103 and the second vent valve 104 to discharge the pressurized gas in the second hermetic space S2 and the pressurized gas in the master container 80 through the holder-side exhaust line 97 and the master-side exhaust line 98. The second leak check is performed in this manner to test the sealing performance of the second sealing projection 47.

Although in this embodiment the pressurized gas is first introduced into the first hermetic space S1 and then into the second hermetic space S2, it is possible to first introduce the pressurized gas into the second hermetic space S2 and then into the first hermetic space S1. In either case, in the event of gas leakage, it is possible to identify which of the first sealing projection 48 and the second sealing projection 47 has a failure.

Figure 8:
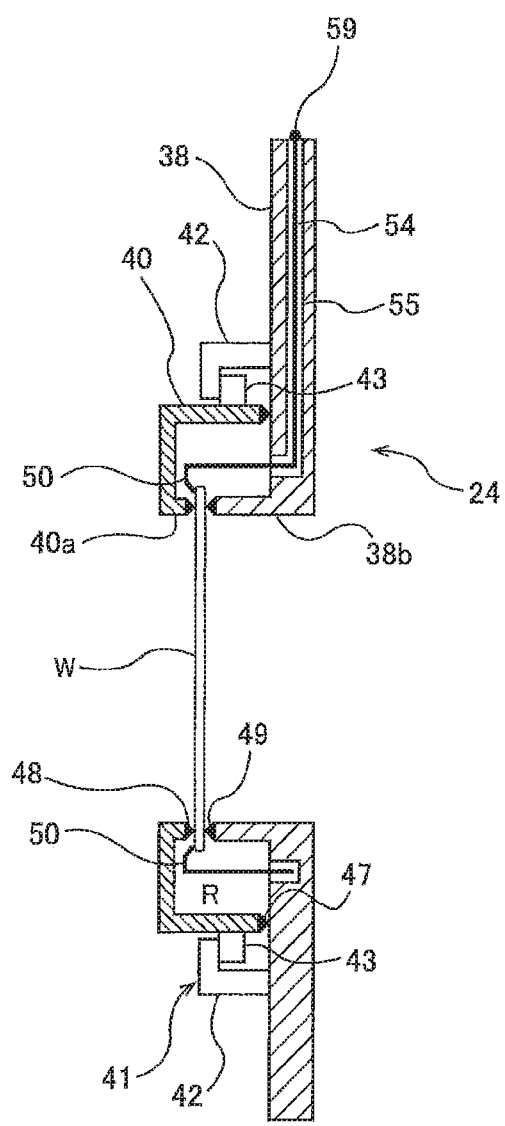
FIG. 8 is a cross-sectional view showing another embodiment of a substrate holder.

Another embodiment of the substrate holder 24 will now be described with reference to FIG. 8. The constructions of this embodiment, not particularly described here, are the same as the constructions of the substrate holder 24 shown in FIG. 2, and duplicate descriptions thereof are omitted. As shown in FIG. 8, the first holding member 38 of the substrate holder 24 has an opening 38b which is smaller than the back surface of the substrate W. In this embodiment, the opening 38b has a circular shape, and its diameter is smaller than the diameter of the substrate W. The size (diameter) of the opening 38b of the first holding member 38 is equal to the size (diameter) of the opening 40a of the second holding member 40. The first holding member 38 has an endless back-side sealing projection 49 which can contact the peripheral portion of the back surface of the substrate W. The back-side sealing projection 49 may be a sealing member such as an O-ring. In an embodiment, a part of the first holding member 38 itself, including the back-side sealing projection 49, may be formed of a material having a sealing function. In this embodiment, the back-side sealing projection 49 has an annular shape. The back-side sealing projection 49 has the same size (diameter) as the first sealing projection 48 of the second holding member 40 and is arranged concentrically with the first sealing projection 48.

When the substrate W is held by the substrate holder 24, the back surface of the substrate W is exposed through the opening 38b of the first holding member 38, and the front surface (to-be-plated surface) of the substrate W is exposed through the opening 40a of the second holding member 40. Further, the back-side sealing projection 49, the second sealing projection 47 and the first sealing projection 48 are pressed against the peripheral portion of the back surface of the substrate W, the first holding member 38 and the peripheral portion of the front surface of the substrate W, respectively. The back-side sealing projection 49 seals a gap between the first holding member 38 and the back surface of the substrate W, the second sealing projection 47 seals the gap between the first holding member 38 and the second holding member 40, and the first sealing projection 48 seals the gap between the second holding member 40 and the front surface of the substrate W. Consequently, an internal space R is formed in the substrate holder 24. The back-side sealing projection 49, the first sealing projection 48 and the second sealing projection 47 face the internal space R. This internal space R communicates with the atmosphere through the wire passage 55. Accordingly, the atmospheric pressure is produced in the internal space R.

Figure 9:
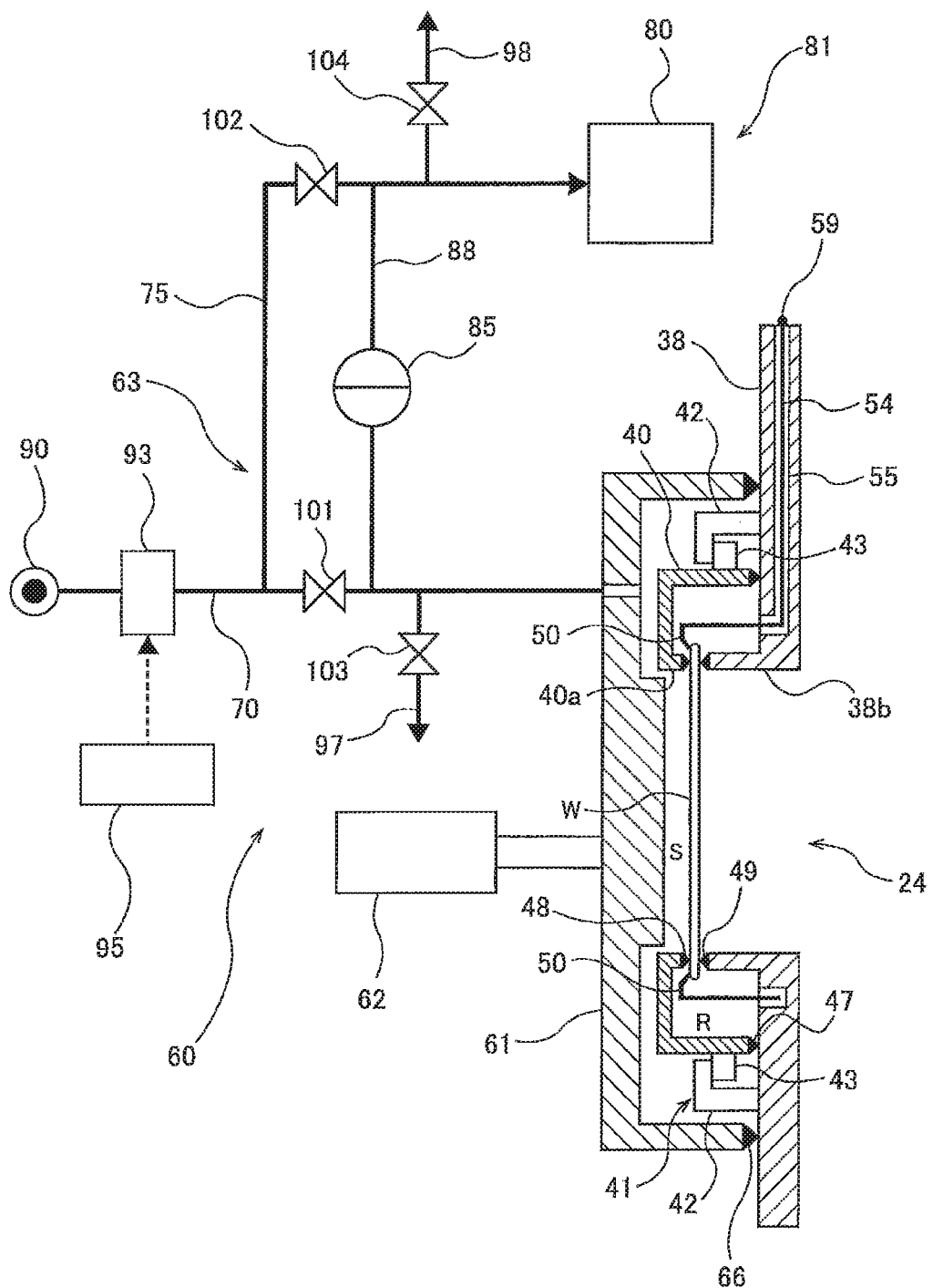
FIG. 9 is a diagram showing a manner in which the sealing performances of the first sealing projection and the second sealing projection are tested by using the leak checking apparatus shown in FIG. 3.

In an embodiment, the sealing performances of the first sealing projection 48, the second sealing projection 47 and the back-side sealing projection 49 of the substrate holder 24 shown in FIG. 8 are tested using the leak checking apparatus 60 shown in FIG. 3. FIG. 9 is a diagram showing a manner in which the sealing performances of the first sealing projection 48 and the second sealing projection 47 are tested by using the leak checking apparatus 60 shown in FIG. 3. The sealing performance test for the first sealing projection 48 and the second sealing projection 47 is performed in accordance with the flow chart shown in FIG. 4. Thus, the sealing cap 61 is disposed on the first holding member 38 of the substrate holder 24 such that the sealing cap 61 covers the entireties of the front surface of the substrate W, exposed through the opening 40a, and the second holding member 40, and then the gas seal 66 of the sealing cap 61 is pressed against the first holding member 38 by the pressing mechanism 62, thereby forming a front-side hermetic space S between the sealing cap 61 and the substrate holder 24. The front-side hermetic space S corresponds to the hermetic space S in the above-described embodiment.

The test of the sealing performances of the first sealing projection 48 and the second sealing projection 47 is performed by checking whether the pressurized gas in the front-side hermetic space S leaks through the sealing projections 47, 48. The pressurized-gas supply system 63 supplies the pressurized gas at the same pressure to the front-side hermetic space S and to the master container 80. If the pressure difference between the pressurized gas in the front-side hermetic space S and the pressurized gas in the master container 80 has not exceeded a threshold value within the set time, the differential-pressure measuring device 85 emits a signal indicating that there is no leakage of the pressurized gas (i.e. the first sealing projection 48 and the second sealing projection 47 are functioning properly). If the pressure difference has exceeded the threshold value within the set time, the differential-pressure measuring device 85 emits a signal indicating that there is leakage of the pressurized gas (i.e. there is a failure of the first sealing projection 48 and/or the second sealing projection 47).

Figure 10:
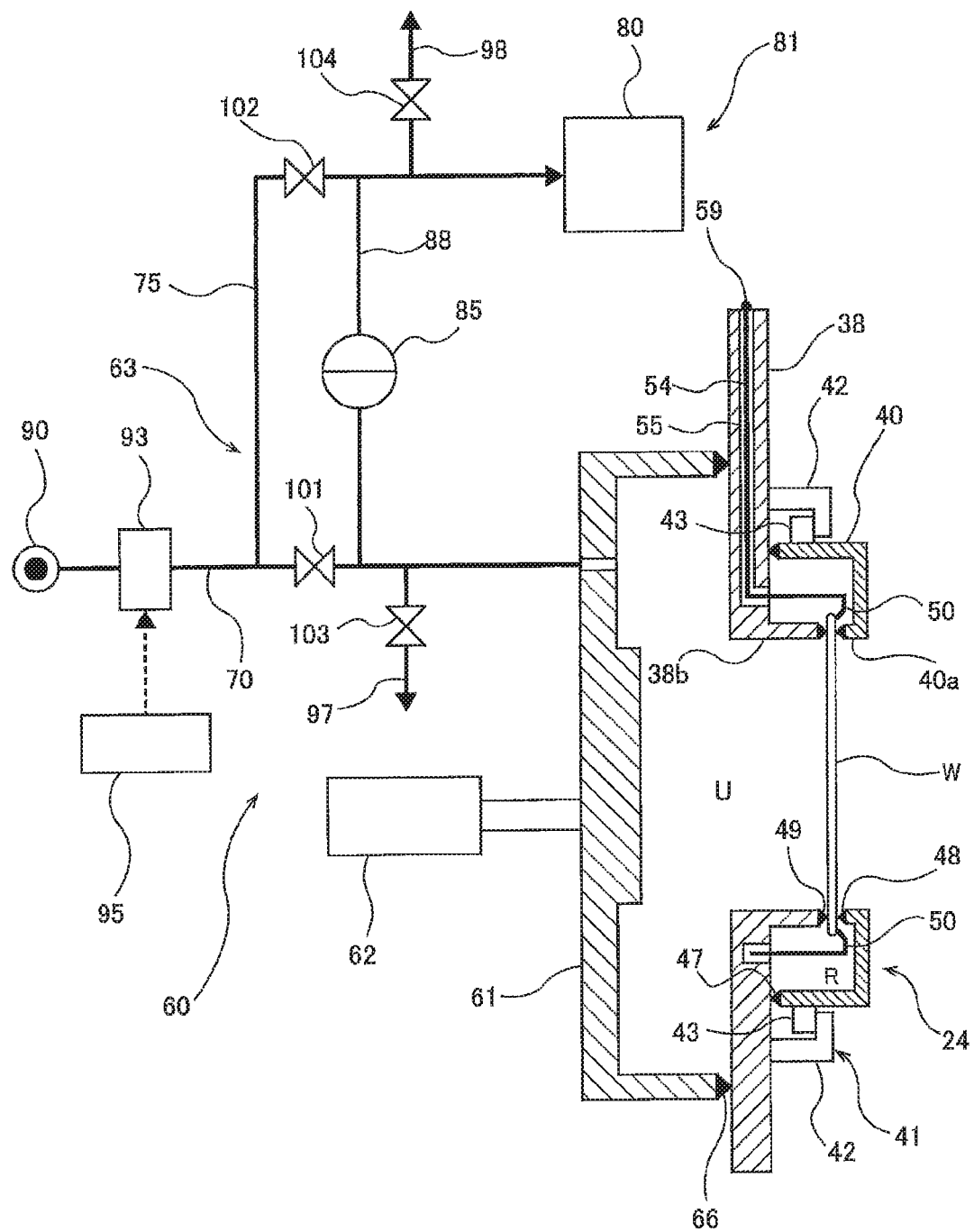
FIG. 10 is a diagram showing a manner in which the sealing performance of a back-side sealing projection is tested by using the leak checking apparatus shown in FIG. 3.

FIG. 10 is a diagram showing a manner in which the sealing performance of the back-side sealing projection 49 is tested by using the leak checking apparatus 60 shown in FIG. 3. The seal performance test for the back-side sealing projection 49 is performed on the substrate holder 24 with its back side facing the sealing cap 61. As shown in FIG. 10, the sealing cap 61 is disposed on the first holding member 38 of the substrate holder 24 such that the sealing cap 61 covers the back surface of the substrate W exposed through the opening 38b. While the gas seal 66 is in contact with the back surface of the first holding member 38, the sealing cap 61 is pressed against the substrate holder 24 by the pressing mechanism 62. The gas seal 66 is pressed against the back surface of the first holding member 38 to seal a gap between the sealing cap 61 and the first holding member 38, thereby forming a back-side hermetic space U between the sealing cap 61 and the substrate holder 24.

The back-side hermetic space U is formed by the sealing cap 61, the first holding member 38 of the substrate holder 24, and the back surface of the substrate W exposed through the opening 38b of the first holding member 38. The exposed back surface of the substrate W and the back-side sealing projection 49 are covered by the sealing cap 61, and face the back-side hermetic space U. As with the sealing performance test for the sealing projections 47, 48, the test of the sealing performance of the back-side sealing projection 49 is performed by checking whether the pressurized gas in the back-side hermetic space U leaks through the back-side sealing projection 49.

Figure 4:
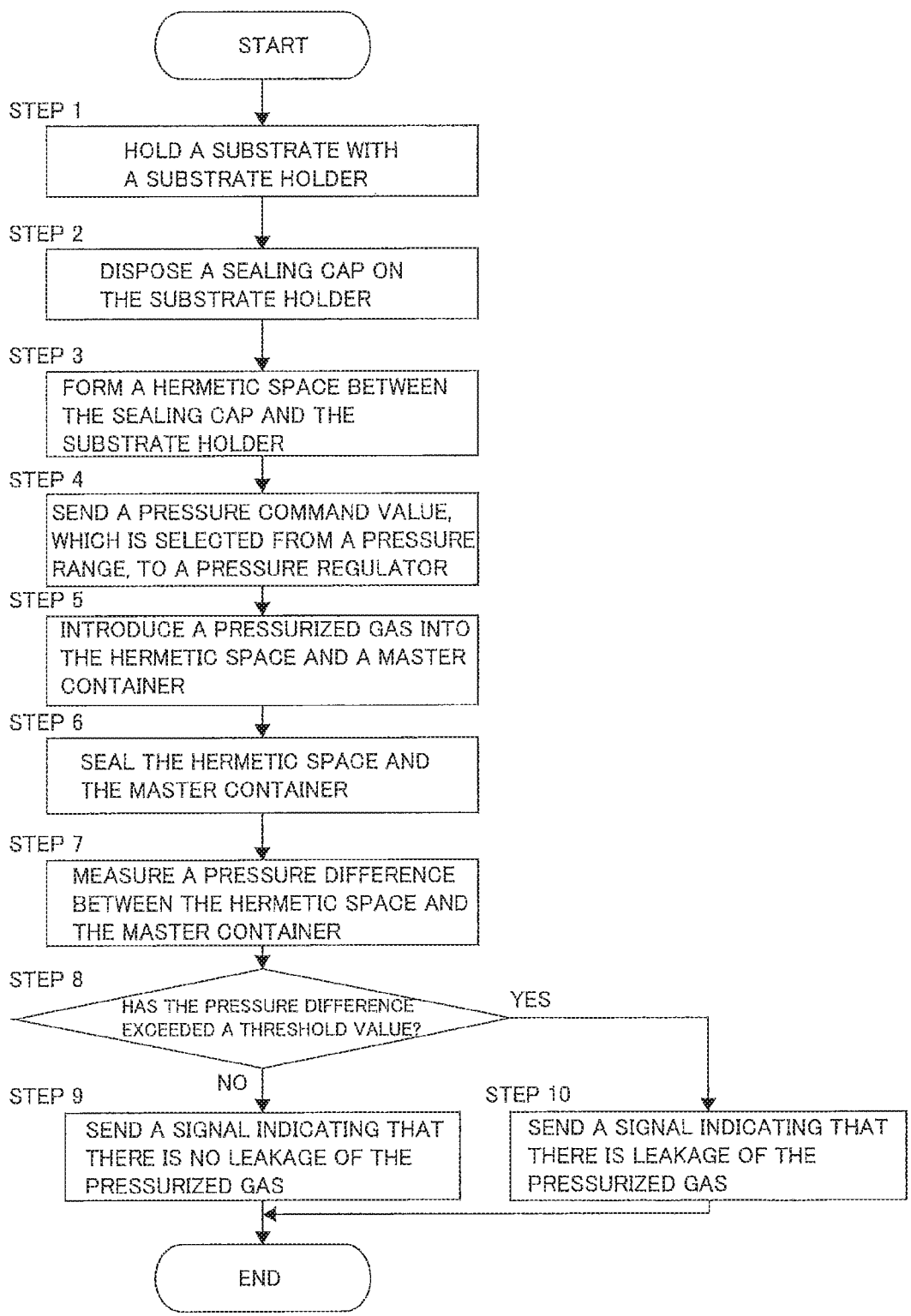
FIG. 4 is a flow chart illustrating a leak checking method performed by using the leak checking apparatus shown in FIG. 3.

The sealing performance test for the back-side sealing projection 49 is performed by following the flow chart shown in FIG. 4 (except step 1). Specifically, the sealing cap 61 is disposed on the first holding member 38 of the substrate holder 24 such that the sealing cap 61 covers the entirety of the back surface of the substrate W exposed through the opening 38b. The gas seal 66 of the sealing cap 61 is pressed against the back surface of the first holding member 38 by the pressing mechanism 62, thereby forming the back-side hermetic space U between the sealing cap 61 and the substrate holder 24. The pressurized-gas supply system 63 supplies the pressurized gas at the same pressure into the back-side hermetic space U and into the master container 80. If the pressure difference between the pressurized gas in the back-side hermetic space U and the pressurized gas in the master container 80 has not exceeded a threshold value within the set time, the differential-pressure measuring device 85 emits a signal indicating that there is no leakage of the pressurized gas (i.e. the back-side sealing projection 49 is functioning properly). If the pressure difference has exceeded the threshold value within the set time, the differential-pressure measuring device 85 emits a signal indicating that there is leakage of the pressurized gas (i.e. there is a failure of the back-side sealing projection 49).

Figure 11:
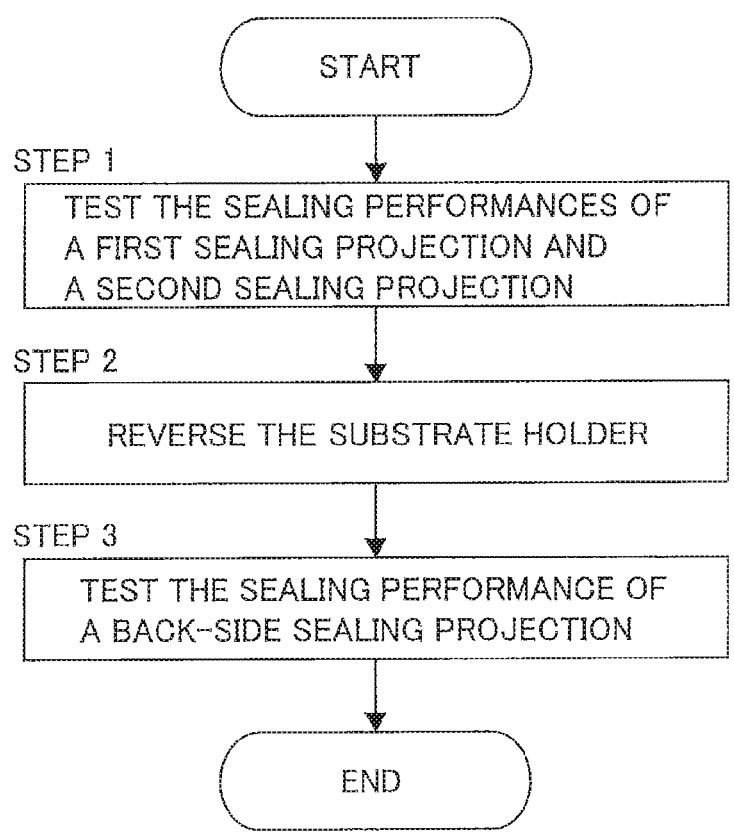
FIG. 11 is a flow chart of the leak check for the first sealing projection, the second sealing projection and the back-side sealing projection of the substrate holder, shown in FIGS. 9 and 10.

FIG. 11 is a flow chart of the leak check for the second sealing projection 47, the first sealing projection 48 and the back-side sealing projection 49 of the substrate holder 24, shown in FIGS. 9 and 10. First, the test of the sealing performances of the first sealing projection 48 and the second sealing projection 47 is performed by following the flow chart shown in FIG. 4 (step 1). The step 1 is performed in the state illustrated in FIG. 9. Next, the substrate holder 24 is reversed (step 2). The test of the sealing performance of the back-side sealing projection 49 is then performed by following the flow chart shown in FIG. 4 (except the step 1 of FIG. 4) (step 3). This step 3 is performed in the state illustrated in FIG. 10.

Figure 12:
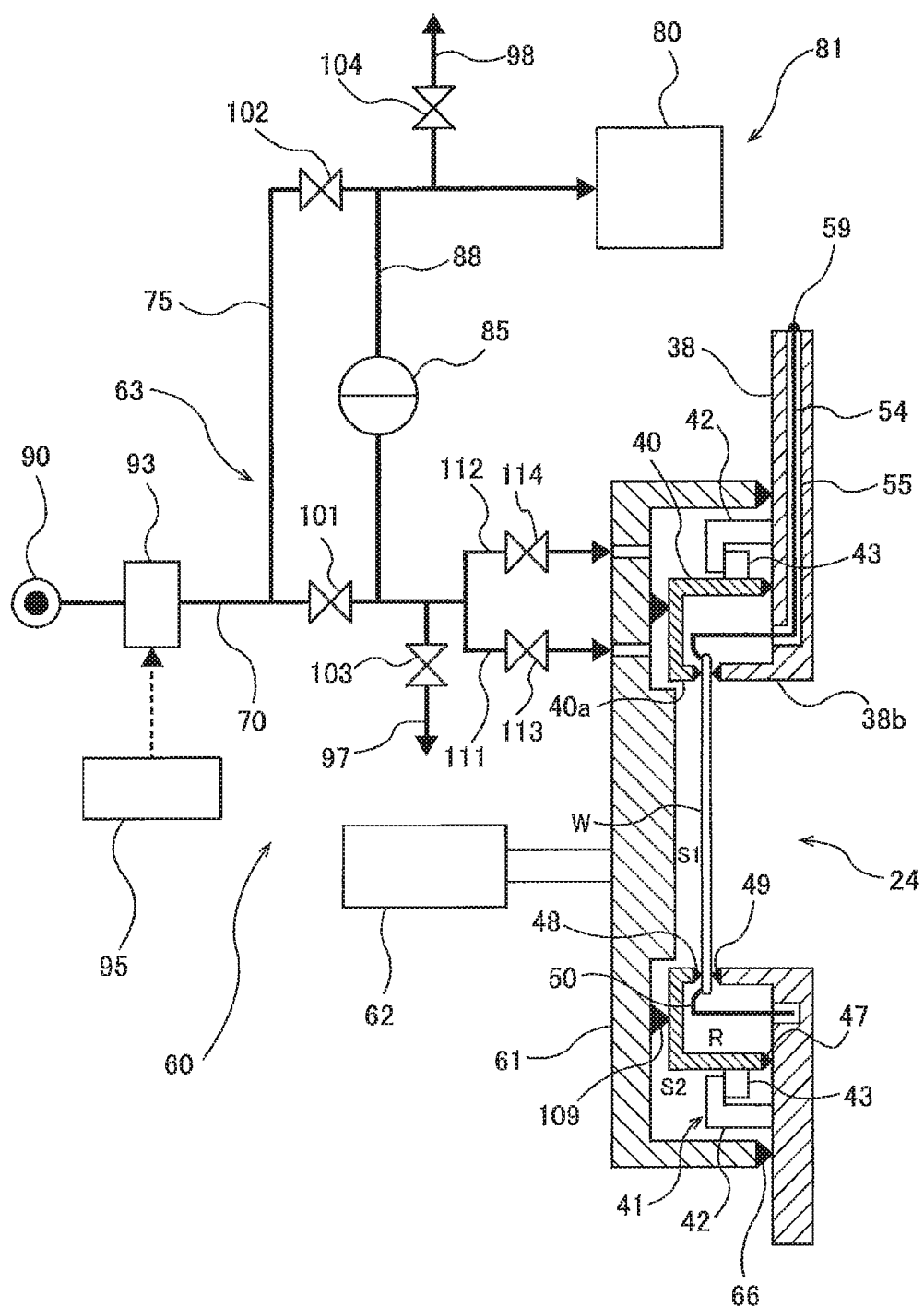
FIG. 12 is a diagram showing a manner in which the sealing performances of the first sealing projection and the second sealing projection are tested by using the leak checking apparatus shown in FIG. 5.

A description will now be given of an embodiment in which a leak check for the first sealing projection 48, the second sealing projection 47 and the back-side sealing projection 49 of the substrate holder 24 shown in FIG. 8 is performed by using the leak checking apparatus 60 shown in FIG. 5. FIG. 12 is a diagram showing a manner in which the sealing performances of the first sealing projection 48 and the second sealing projection 47 are tested by using the leak checking apparatus 60 shown in FIG. 5. The test to determine whether the pressurized gas leaks through the first sealing projection 48 and the second sealing projection 47 is performed by following the flow chart shown in FIGS. 6 and 7. Specifically, the sealing cap 61 is disposed on the first holding member 38 of the substrate holder 24 such that the sealing cap 61 covers the entireties of the front surface of the substrate W, exposed through the opening 40a, and the second holding member 40. The pressing mechanism 62 presses the gas seal 66 and the partition seal 109 against the first holding member 38 and the second holding member 40, respectively, thereby forming a first hermetic space S1 and a second hermetic space S2 between the sealing cap 61 and the substrate holder 24. These first hermetic space S1 and second hermetic space S2 correspond to the first hermetic space S1 and the second hermetic space S2 in the above-described embodiment.

The pressurized-gas supply system 63 supplies the pressurized gas at the same pressure into the first hermetic space S1 and into the master container 80. If the pressure difference between the pressurized gas in the first hermetic space S1 and the pressurized gas in the master container 80 has not exceeded a threshold value within the set time, the differential-pressure measuring device 85 emits a signal indicating that there is no leakage of the pressurized gas (i.e. the first sealing projection 48 is functioning properly). If the pressure difference has exceeded the threshold value within the set time, the differential-pressure measuring device 85 emits a signal indicating that there is leakage of the pressurized gas (i.e. there is a failure of the first sealing projection 48).

Subsequently, the pressurized-gas supply system 63 supplies the pressurized gas at the same pressure to the second hermetic space S2 and to the master container 80. If the pressure difference between the pressurized gas in the second hermetic space S2 and the pressurized gas in the master container 80 has not exceeded a threshold value within the set time, the differential-pressure measuring device 85 emits a signal indicating that there is no leakage of the pressurized gas (i.e. the second sealing projection 47 is functioning properly). If the pressure difference has exceeded the threshold value within the set time, the differential-pressure measuring device 85 emits a signal indicating that there is leakage of the pressurized gas (i.e. there is a failure of the second sealing projection 47).

Figure 13:
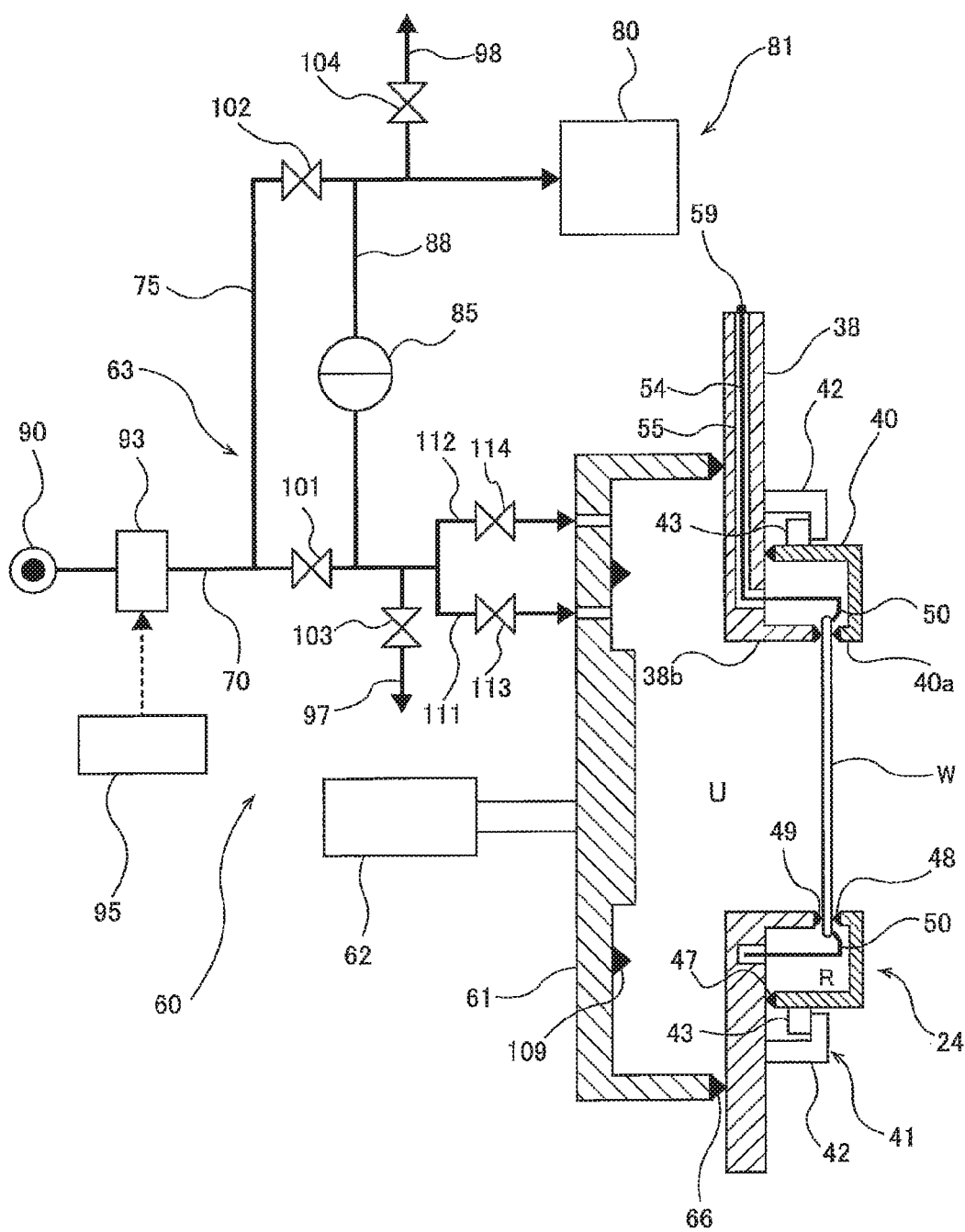
FIG. 13 is a diagram showing a manner in which the sealing performance of the back-side sealing projection is tested by using the leak checking apparatus shown in FIG. 5.

FIG. 13 is a diagram showing a manner in which the sealing performance of the back-side sealing projection 49 is tested by using the leak checking apparatus 60 shown in FIG. 5. The test to determine whether the pressurized gas leaks through the back-side sealing projection 49 is performed by following the flow chart shown in FIG. 4 (except step 1). Specifically, the sealing cap 61 is disposed on the first holding member 38 of the substrate holder 24 such that the sealing cap 61 covers the entirety of the back surface of the substrate W exposed through the opening 38b, and then the gas seal 66 of the sealing cap 61 is pressed against the back surface of the first holding member 38 by the pressing mechanism 62, thereby forming the back-side hermetic space U between the sealing cap 61 and the substrate holder 24.

The pressurized-gas supply system 63 supplies the pressurized gas at the same pressure into the back-side hermetic space U and into the master container 80. If the pressure difference between the pressurized gas in the back-side hermetic space U and the pressurized gas in the master container 80 has not exceeded a threshold value within the set time, the differential-pressure measuring device 85 emits a signal indicating that there is no leakage of the pressurized gas (i.e. the back-side sealing projection 49 is functioning properly). If the pressure difference has exceeded the threshold value within the set time, the differential-pressure measuring device 85 emits a signal indicating that there is leakage of the pressurized gas (i.e. there is a failure of the back-side sealing projection 49). One or both of the first branch line 111 and the second branch line 112 may be used in this test. The leak check can be performed in a shorter time by increasing the pressure of the pressurized gas itself in the master container 80.

Figure 14:
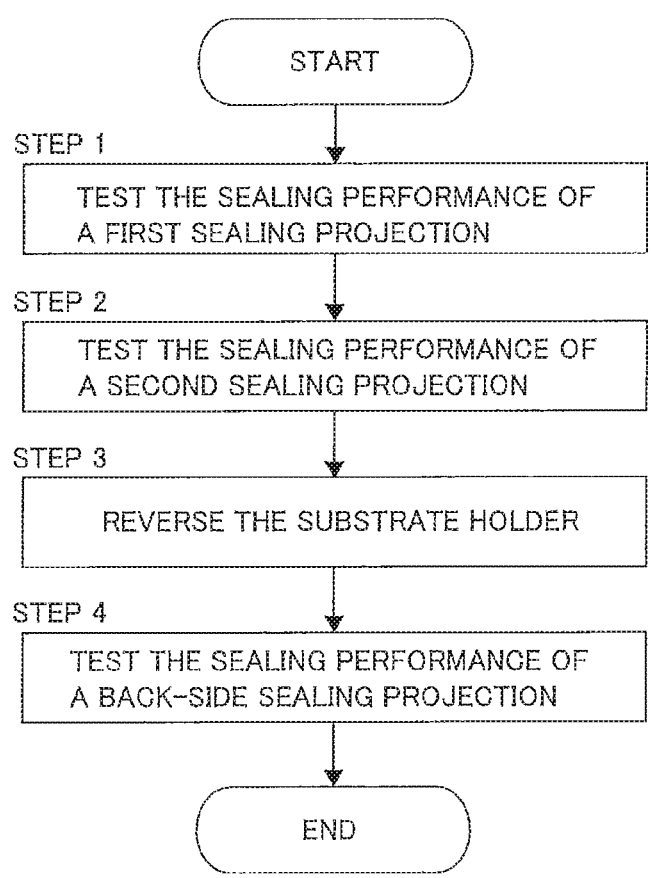
FIG. 14 is a flow chart showing the leak check for the first sealing projection, the second sealing projection and the back-side sealing projection of the substrate holder, shown in FIGS. 12 and 13.

FIG. 14 is a flow chart showing the leak check for the first sealing projection 48, the second sealing projection 47 and the back-side sealing projection 49 of the substrate holder 24, shown in FIGS. 12 and 13. First, the test of the sealing performances of the first sealing projection 48 and the second sealing projection 47 is performed by following the flow chart shown in FIGS. 6 and 7 (step 1 and step 2). These steps 1 and 2 are performed in the state illustrated in FIG. 12. The seal performance test may be first performed on the second sealing projection 47 and then on the first sealing projection 48. Next, the substrate holder 24 is reversed (step 3). The test of the sealing performance of the back-side sealing projection 49 is then performed by following the flow chart shown in FIG. 4 (except the step 1 of FIG. 4) (step 4). This step 4 is performed in the state illustrated in FIG. 13. Instead of reversing the substrate holder 24, the leak checking apparatus 60 may be moved or reversed in step 3.

Another embodiment of the substrate holder 24 will now be described with reference to FIG. 15. The constructions of this embodiment, not particularly described here, are the same as the constructions of the substrate holder 24 shown in FIG. 8, and duplicate descriptions thereof are omitted. The substrate holder 24 shown in FIG. 15 includes a first holding member 38 and a second holding member 40 which have the same size. A coupling mechanism 41 is mounted on the outer surfaces of the first holding member 38 and the second holding member 40. A substrate W is interposed between the first holding member 38 and the second holding member 40, and then the first holding member 38 and the second holding member 40 are secured to each other by the coupling mechanism 41, whereby the substrate W is held by the substrate holder 24.

The first holding member 38 has an endless back-side sealing projection 49 which can contact a peripheral portion of the back surface of the substrate W. In this embodiment, the back-side sealing projection 49 has an annular shape. The first holding member 38 also has an endless intermediate sealing member 116 for sealing a gap between the first holding member 38 and the second holding member 40. This intermediate sealing member 116 corresponds to the second sealing projection 47 in the above-described embodiment. In an embodiment, the intermediate sealing member 116 may be provided on the second holding member 40.

The second holding member 40 has an endless front-side sealing projection 117 which can contact a peripheral portion of the front surface of the substrate W. The front-side sealing projection 117 corresponds to the first sealing projection 48 in the above-described embodiment. In this embodiment, the front-side sealing projection 117 has an annular shape. The back-side sealing projection 49 has the same size (diameter) as the front-side sealing projection 117 and is arranged concentrically with the front-side sealing projection 117. The front-side sealing projection 117 may be a sealing member such as an O-ring. In an embodiment, the second holding member 40 itself, including the front-side sealing projection 117, may be formed of a material having a sealing function.

When the substrate W is held by the substrate holder 24, the back surface of the substrate W is exposed through the opening 38b of the first holding member 38, and the front surface (to-be-plated surface) of the substrate W is exposed through the opening 40a of the second holding member 40. Further, the back-side sealing projection 49, the front-side sealing projection 117 and the intermediate sealing member 116 are pressed against a peripheral portion of the back surface of the substrate W, a peripheral portion of the front surface of the substrate W and the second holding member 40, respectively. The back-side sealing projection 49 seals the gap between the first holding member 38 and the back surface of the substrate W, the front-side sealing projection 117 seals the gap between the second holding member 40 and front surface of the substrate W, and the intermediate sealing member 116 seals the gap between the first holding member 38 and the second holding member 40. Consequently, an internal space R is formed in the substrate holder 24. The back-side sealing projection 49 and the front-side sealing projection 117 face the internal space R. This internal space R communicates with the atmosphere through the wire passage 55. Accordingly, the atmospheric pressure is produced in the internal space R.

The first holding member 38 includes a plurality of positioning members 115 which contact an edge portion of the substrate W. The position of the substrate W relative to the substrate holder 24 is fixed by the positioning members 115. In an embodiment, the second holding member 40 may include the positioning members 115.

Figure 15:
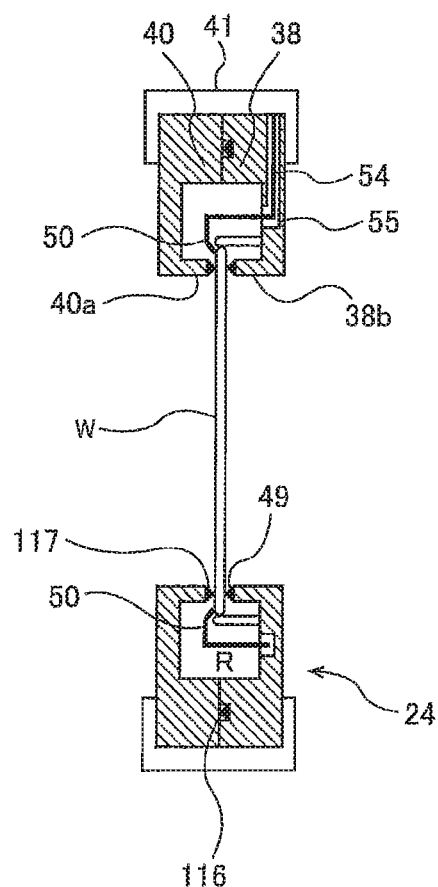
FIG. 15 is a cross-sectional view showing yet another embodiment of a substrate holder.
Figure 16:
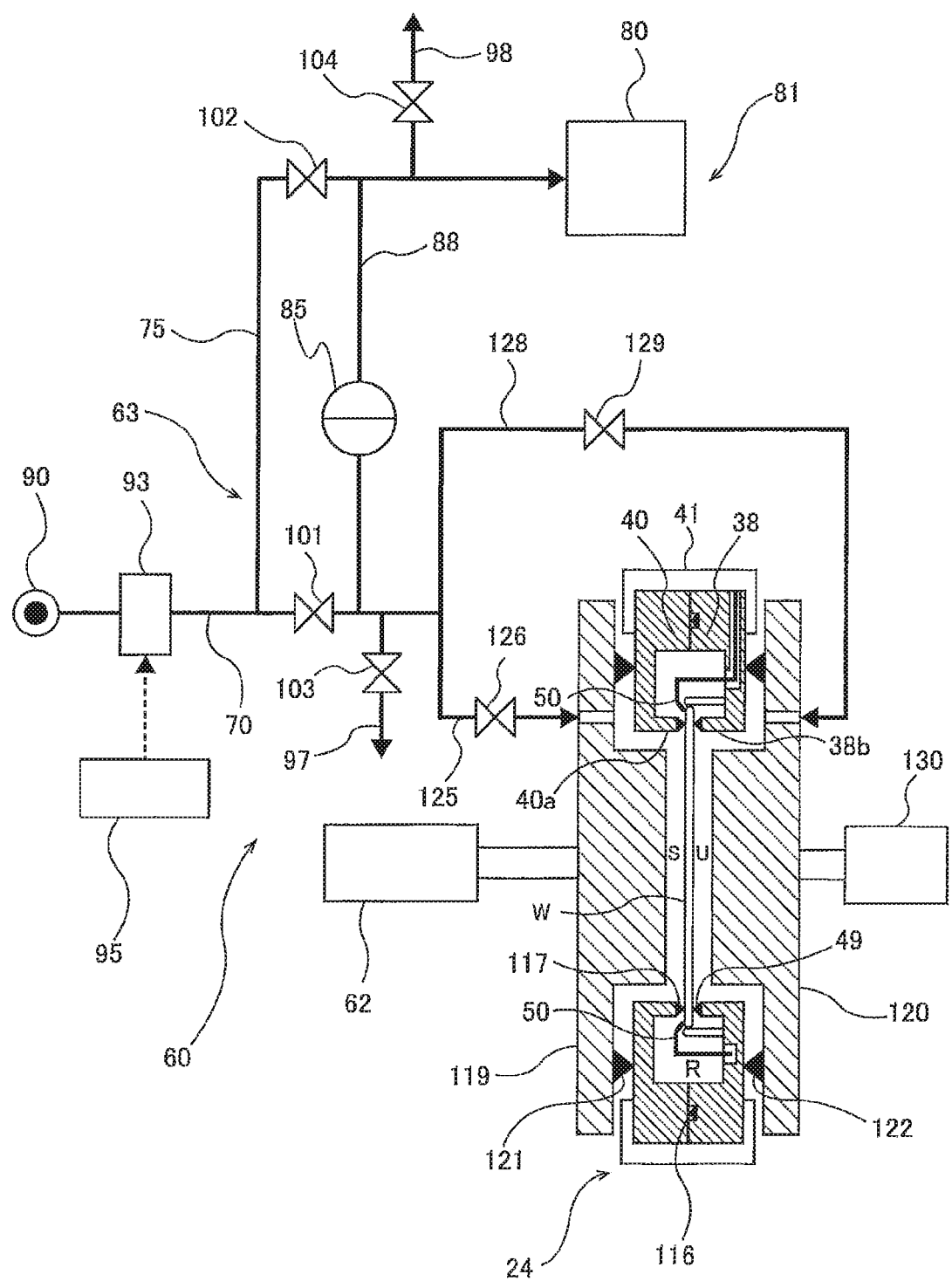
FIG. 16 is a diagram showing an embodiment of a leak checking apparatus for performing a leak check on the front-side sealing projection and the back-side sealing projection of the substrate holder shown in FIG. 15.

FIG. 16 is a diagram showing an embodiment of a leak checking apparatus 60 for performing a leak check on the front-side sealing projection 117 and the back-side sealing projection 49 of the substrate holder 24 shown in FIG. 15. The constructions of the leak checking apparatus 60 of this embodiment, not particularly described here, are the same as the constructions of the leak checking apparatus 60 shown in FIG. 3, and duplicate descriptions thereof are omitted. The leak checking apparatus 60 of this embodiment includes a front-side sealing cap 119 to be disposed on the front side of the substrate holder 24, and a back-side sealing cap 120 to be disposed on the back side of the substrate holder 24.

Each of the front-side sealing cap 119 and the back-side sealing cap 120 is a rigid body which does not permit passage of a gas, and has a larger size than the substrate W. The front-side sealing cap 119 has a shape which is larger than the opening 40a of the second holding member 40 and which can cover the opening 40a and the front-side sealing projection 117. The back-side sealing cap 120 has a shape which is larger than the opening 38b of the first holding member 38 and which can cover the opening 38b and the back-side sealing projection 49.

The front-side sealing cap 119 has an endless front-side gas seal 121. In this embodiment, the front-side gas seal 121 has an annular shape. The front-side gas seal 121 is larger than the opening 40a of the second holding member 40. That is to say, the front-side gas seal 121 has a diameter larger than the diameter of the opening 40a of the second holding member 40. The front-side sealing cap 119 is coupled to a pressing mechanism 62 comprised of an air cylinder, an electric actuator, or the like. The pressing mechanism 62 is configured to press the front-side gas seal 121 of the front-side sealing cap 119 against the front surface of the second holding member 40. The gap between the front-side sealing cap 119 and the second holding member 40 is sealed with the front-side gas seal 121, whereby a front-side hermetic space S is formed between the front-side sealing cap 119 and the front side of the substrate holder 24. This front-side hermetic space S corresponds to the hermetic space S in the above-described embodiment.

The back-side sealing cap 120 has an endless back-side gas seal 122. In this embodiment, the back-side gas seal 122 has an annular shape. The back-side gas seal 122 is larger than the opening 38b of the first holding member 38. That is to say, the back-side gas seal 122 has a diameter larger than the diameter of the opening 38b of the first holding member 38. The back-side sealing cap 120 is coupled to a pressing mechanism 130 comprised of an air cylinder, an electric actuator, or the like. The pressing mechanism 130 is configured to press the back-side gas seal 122 of the back-side sealing cap 120 against the back surface of the first holding member 38. The gap between the back-side sealing cap 120 and the first holding member 38 is sealed with the back-side gas seal 122, whereby a back-side hermetic space U is formed between the back-side sealing cap 120 and the back side of the substrate holder 24.

The pressurized-gas introduction line 70 branches into a front-side branch line 125 and a back-side branch line 128. The front-side branch line 125 and the back-side branch line 128 are located downstream of the bridge line 88. The front-side branch line 125 is coupled to the front-side sealing cap 119, and the back-side branch line 128 is coupled to the back-side sealing cap 120. The front-side branch line 125 communicates with the front-side hermetic space S, and the back-side branch line 128 communicates with the back-side hermetic space U.

The front-side branch line 125 is provided with a front-side branch valve 126, and the back-side branch line 128 is provided with a back-side branch valve 129. By opening the front-side branch valve 126 and/or the back-side branch valve 129, the pressurized gas can be supplied into the front-side hermetic space S and/or the back-side hermetic space U. The operations of the front-side branch valve 126 and the back-side branch valve 129 are controlled by the operation controller 95. In particular, the operation controller 95 is configured to be capable of manipulating the front-side branch valve 126 and the back-side branch valve 129 independently of each other.

The front-side hermetic space S is formed by the front-side sealing cap 119, the second holding member 40 of the substrate holder 24, and the front surface of the substrate W exposed through the opening 40a of the second holding member 40. The exposed front surface of the substrate W and the front-side sealing projection 117 are covered by the front-side sealing cap 119, and face the front-side hermetic space S. The test of the sealing performance of the front-side sealing projection 117 is performed by checking whether the pressurized gas in the front-side hermetic space S leaks through the front-side sealing projection 117.

The back-side hermetic space U is formed by the back-side sealing cap 120, the first holding member 38 of the substrate holder 24, and the back surface of the substrate W exposed through the opening 38b of the first holding member 38. The exposed back surface of the substrate W and the back-side sealing projection 49 are covered by the back-side sealing cap 120, and face the back-side hermetic space U. The test of the sealing performance of the back-side sealing projection 49 is performed by checking whether the pressurized gas in the back-side hermetic space U leaks through the back-side sealing projection 49.

Figure 17:
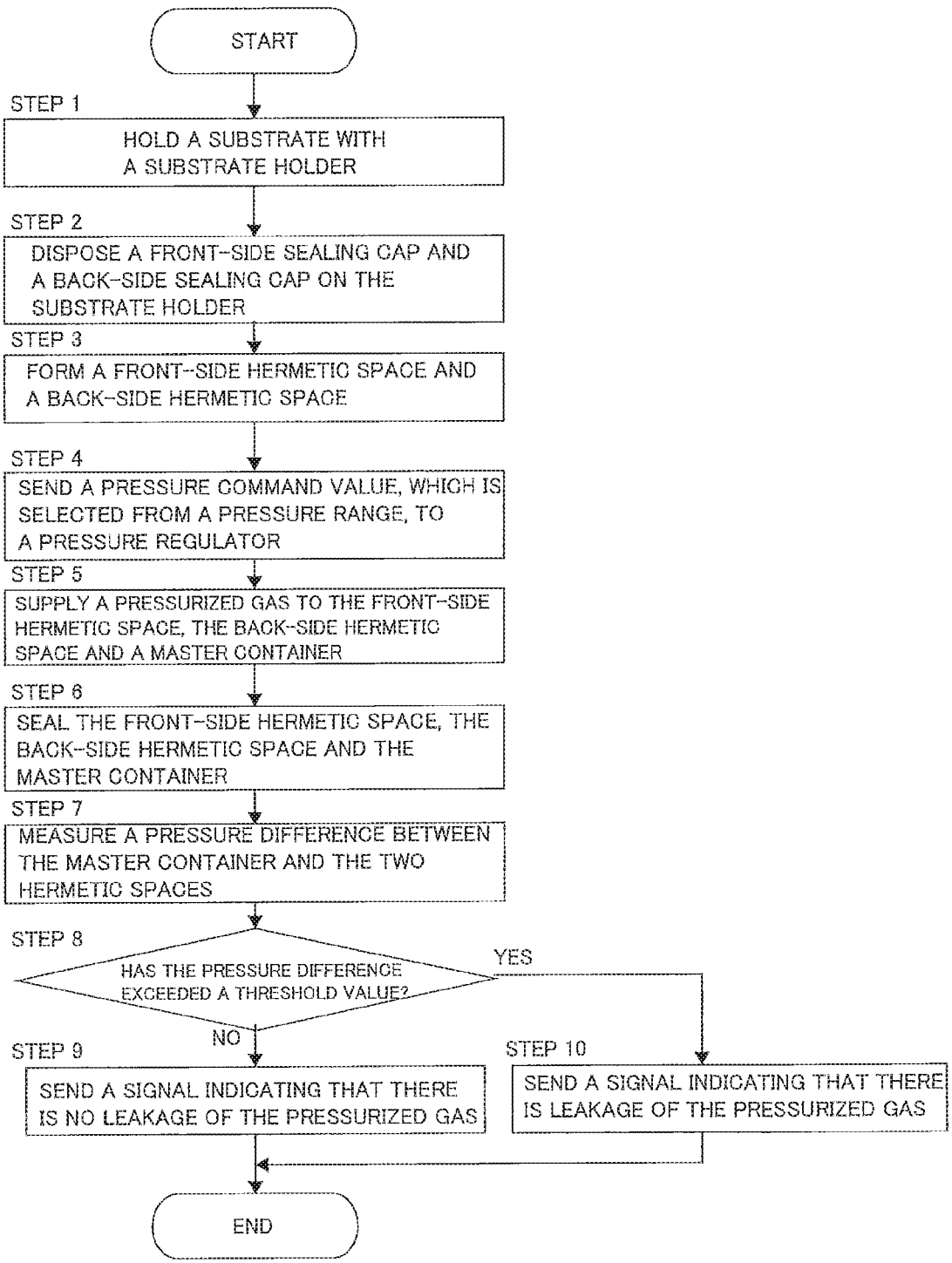
FIG. 17 is a flow chart illustrating an embodiment of a leak checking method performed by using the leak checking apparatus shown in FIG. 16.

An embodiment of a leak checking method performed by using the leak checking apparatus 60 shown in FIG. 16 will now be described with reference to the flow chart of FIG. 17. First, the substrate W is interposed between the first holding member 38 and the second holding member 40 with the back surface and the front surface of the substrate W exposed through the opening 38b of the first holding member 38 and the opening 40a of the second holding member 40, respectively, whereby the substrate W is held by the substrate holder 24 (step 1). When holding the substrate W with the substrate holder 24, the front-side sealing projection 117 of the second holding member 40 seals the gap between a peripheral portion of the front surface of the substrate W and the second holding member 40, the back-side sealing projection 49 of the first holding member 38 seals the gap between a peripheral portion of the back surface of the substrate W and the first holding member 38, and the intermediate sealing member 116 seals the gap between the first holding member 38 and the second holding member 40, thereby forming the internal space R in the substrate holder 24 by the first holding member 38, the second holding member 40 and the substrate W.

Next, the front-side sealing cap 119 is disposed on the second holding member 40 of the substrate holder 24 such that the front-side sealing cap 119 covers the front surface of the substrate W, exposed through the opening 40a, and the second holding member 40. The back-side sealing cap 120 is disposed on the first holding member 38 of the substrate holder 24 such that the back-side sealing cap 120 covers the back surface of the substrate W, exposed through the opening 38b, and the first holding member 38 (step 2). The front-side sealing cap 119 and the back-side sealing cap 120 may be disposed on the substrate holder 24 either simultaneously or at different timings.

The front-side gas seal 121 of the front-side sealing cap 119 is pressed against the second holding member 40 by the pressing mechanism 62 to seal the gap between the second holding member 40 and the front-side sealing cap 119 with the front-side gas seal 121, thereby forming the front-side hermetic space S between the front-side sealing cap 119 and the substrate holder 24. The back-side gas seal 122 of the back-side sealing cap 120 is pressed against the first holding member 38 by the pressing mechanism 130 to seal the gap between the first holding member 38 and the back-side sealing cap 120 with the back-side gas seal 122, thereby forming the back-side hermetic space U between the back-side sealing cap 120 and the substrate holder 24 (step 3).

The operation controller 95 selects a pressure command value from the pressure range stored therein, and sends the pressure command value to the pressure regulator 93 (step 4). The operation controller 95 opens the holder-side valve 101, the master-side valve 102, the front-side branch valve 126 and the back-side branch valve 129 while keeping the first vent valve 103 and the second vent valve 104 closed. The pressurized gas flows through the front-side branch line 125, the back-side branch line 128 and the differential-pressure check line 75 into the front-side hermetic space S, the back-side hermetic space U and the master container 80 (step 5). The pressures of the pressurized gas in the front-side hermetic space S, the back-side hermetic space U and the master container 80 are regulated by the pressure regulator 93, and the operation of the pressure regulator 93 is controlled by the operation controller 95. More specifically, the pressure regulator 93 operates to maintain the pressurized gas in the pressurized-gas introduction line 70 at a pressure corresponding to the pressure command value.

When a predetermined amount of time has elapsed since the holder-side valve 101, the master-side valve 102, the front-side branch valve 126 and the back-side branch valve 129 were opened, the operation controller 95 closes the holder-side valve 101 and the master-side valve 102. The front-side hermetic space S, the back-side hermetic space U and the master container 80 are sealed by the holder-side valve 101 and the master-side valve 102. The front-side hermetic space S, the back-side hermetic space U and the master container 80 are each filled with the pressurized gas having the same pressure (step 6).

With the holder-side valve 101 and the master-side valve 102 closed, the differential-pressure measuring device 85 measures a pressure difference between the pressurized gas in the master container 80 and the pressurized gas in the two hermetic spaces S, U (step 7). The differential-pressure measuring device 85 determines whether the pressure difference has exceeded a threshold value within the set time (step 8). If the pressure difference has not exceeded the threshold value within the set time, the differential-pressure measuring device 85 emits a signal indicating that there is no leakage of the pressurized gas in the front-side hermetic space S and the pressurized gas in the back-side hermetic space U (i.e. the front-side sealing projection 117 and the back-side sealing projection 49 are functioning properly) (step 9). If the pressure difference has exceeded the threshold value within the set time, the differential-pressure measuring device 85 emits a signal indicating that there is leakage of the pressurized gas in the front-side hermetic space S and/or the pressurized gas in the back-side hermetic space U (i.e. there is a failure of the front-side sealing projection 117 and/or the back-side sealing projection 49) (step 10).

The operation controller 95 opens the first vent valve 103 and the second vent valve 104 to discharge the pressurized gas in the front-side hermetic space S and the back-side hermetic space U and the pressurized gas in the master container 80 through the holder-side exhaust line 97 and the master-side exhaust line 98. The leak check is performed in this manner to test the sealing performances of the front-side sealing projection 117 and the back-side sealing projection 49.

Figure 18:
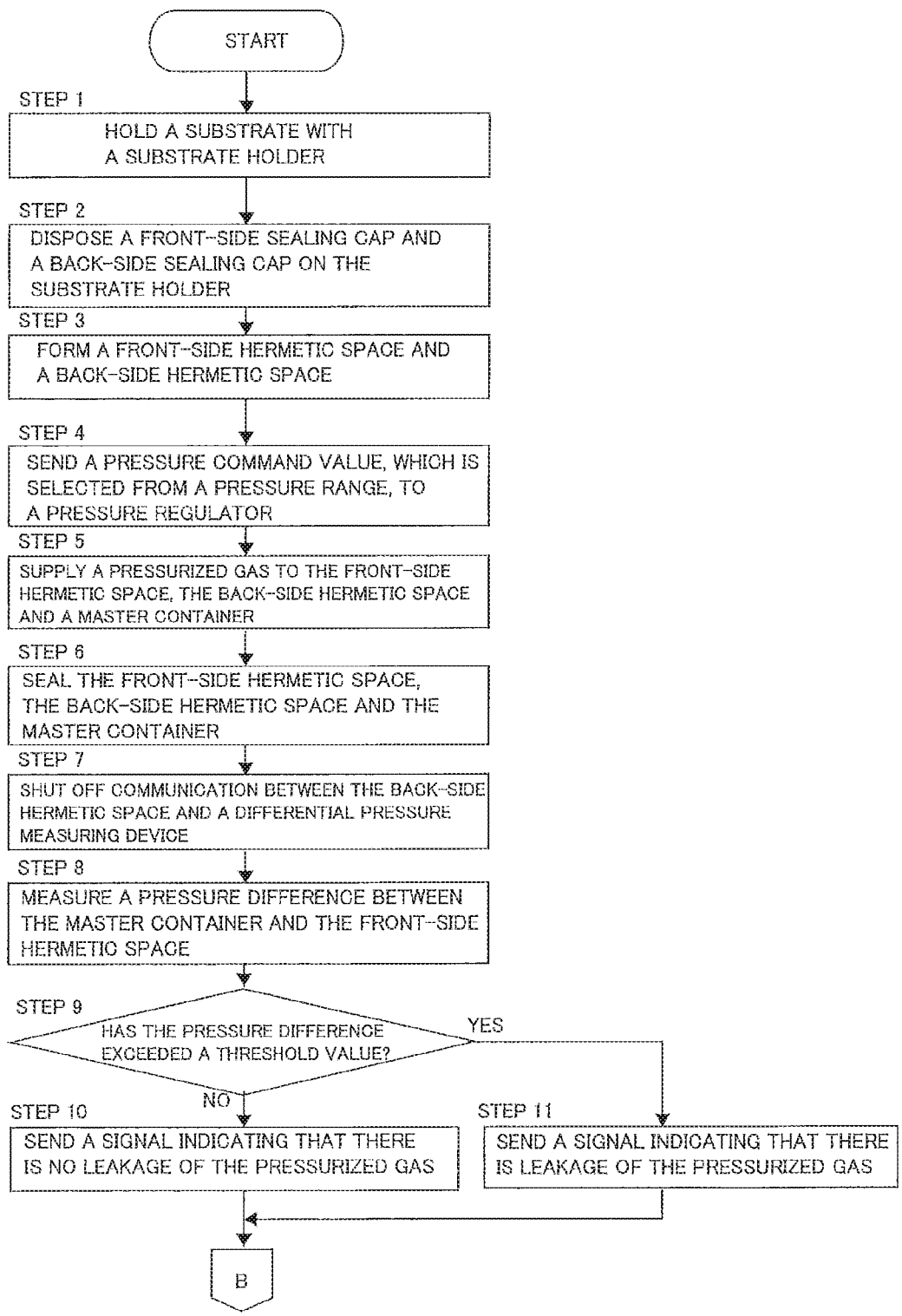
FIG. 18 is a part of a flow chart illustrating an embodiment of a leak checking method performed by using the leak checking apparatus shown in FIG. 16.

FIG. 18 is a flow chart illustrating an embodiment of a leak checking method performed by using the leak checking apparatus 60 shown in FIG. 16. Steps 1 to 6 are the same as the steps 1 to 6 shown in FIG. 17, and a duplicated description thereof is omitted. After step 6, the operation controller 95 closes the back-side branch valve 129 to shut off communication between the differential-pressure measuring device 85 and the back-side hermetic space U (step 7). The differential-pressure measuring device 85 measures a pressure difference between the pressurized gas in the master container 80 and the pressurized gas in the front-side hermetic space S (step 8). The differential-pressure measuring device 85 determines whether the pressure difference has exceeded a threshold value within the set time (step 9). If the pressure difference has not exceeded the threshold value within the set time, the differential-pressure measuring device 85 emits a signal indicating that there is no leakage of the pressurized gas in the front-side hermetic space S (i.e. the front-side sealing projection 117 is functioning properly) (step 10). If the pressure difference has exceeded the threshold value within the set time, the differential-pressure measuring device 85 emits a signal indicating that there is leakage of the pressurized gas in the front-side hermetic space S (i.e. there is a failure of the front-side sealing projection 117) (step 11).

Figure 19:
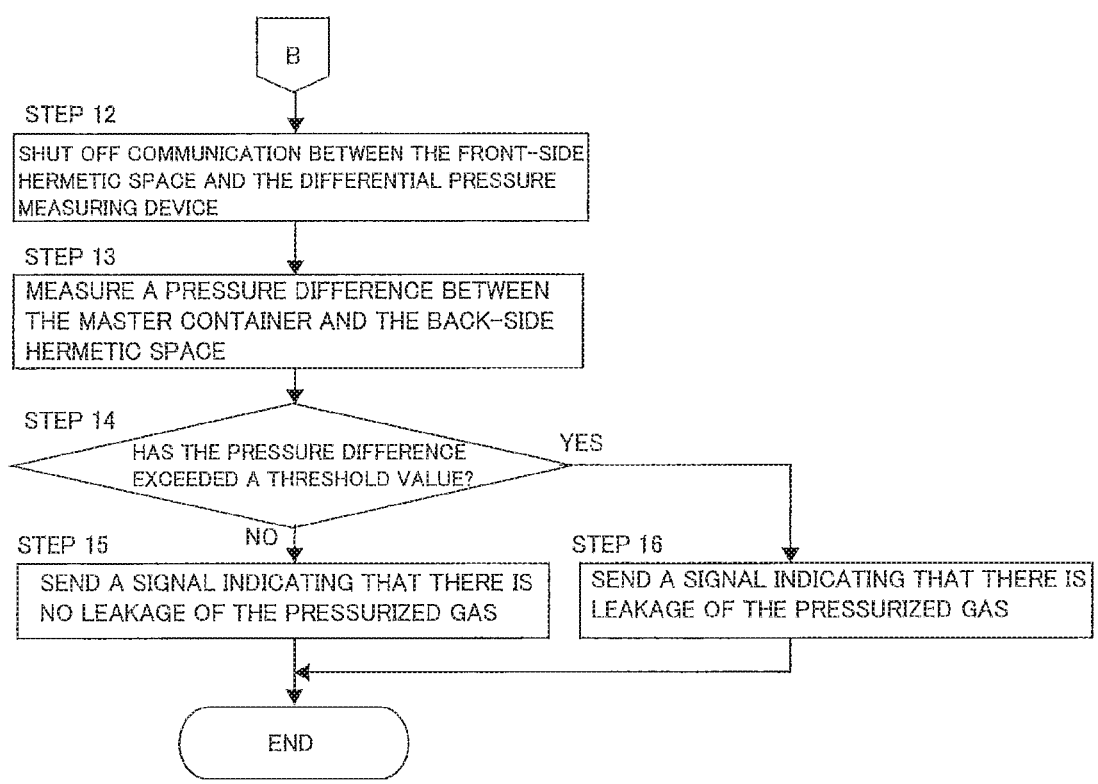
FIG. 19 is other part of the flow chart, following the part shown in FIG. 18.

Next, the operation controller 95 opens the back-side branch valve 129 and closes the front-side branch valve 126 to allow communication between the differential-pressure measuring device 85 and the back-side hermetic space U and to shut off communication between the differential-pressure measuring device 85 and the front-side hermetic space S (step 12 of FIG. 19). The differential-pressure measuring device 85 measures a pressure difference between the pressurized gas in the master container 80 and the pressurized gas in the back-side hermetic space U (step 13). The differential-pressure measuring device 85 determines whether the pressure difference has exceeded a threshold value within the set time (step 14). If the pressure difference has not exceeded the threshold value within the set time, the differential-pressure measuring device 85 emits a signal indicating that there is no leakage of the pressurized gas in the back-side hermetic space U (i.e. the back-side sealing projection 49 is functioning properly) (step 15). If the pressure difference has exceeded the threshold value within the set time, the differential-pressure measuring device 85 emits a signal indicating that there is leakage of the pressurized gas in the back-side hermetic space U (i.e. there is a failure of the back-side sealing projection 49) (step 16).

The operation controller 95 opens the front-side branch valve 126, the first vent valve 103 and the second vent valve 104 to discharge the pressurized gas in the front-side hermetic space S and the back-side hermetic space U and the pressurized gas in the master container 80 through the holder-side exhaust line 97 and the master-side exhaust line 98. The leak check is performed in this manner to test the sealing performances of the front-side sealing projection 117 and the back-side sealing projection 49.

Figure 20:
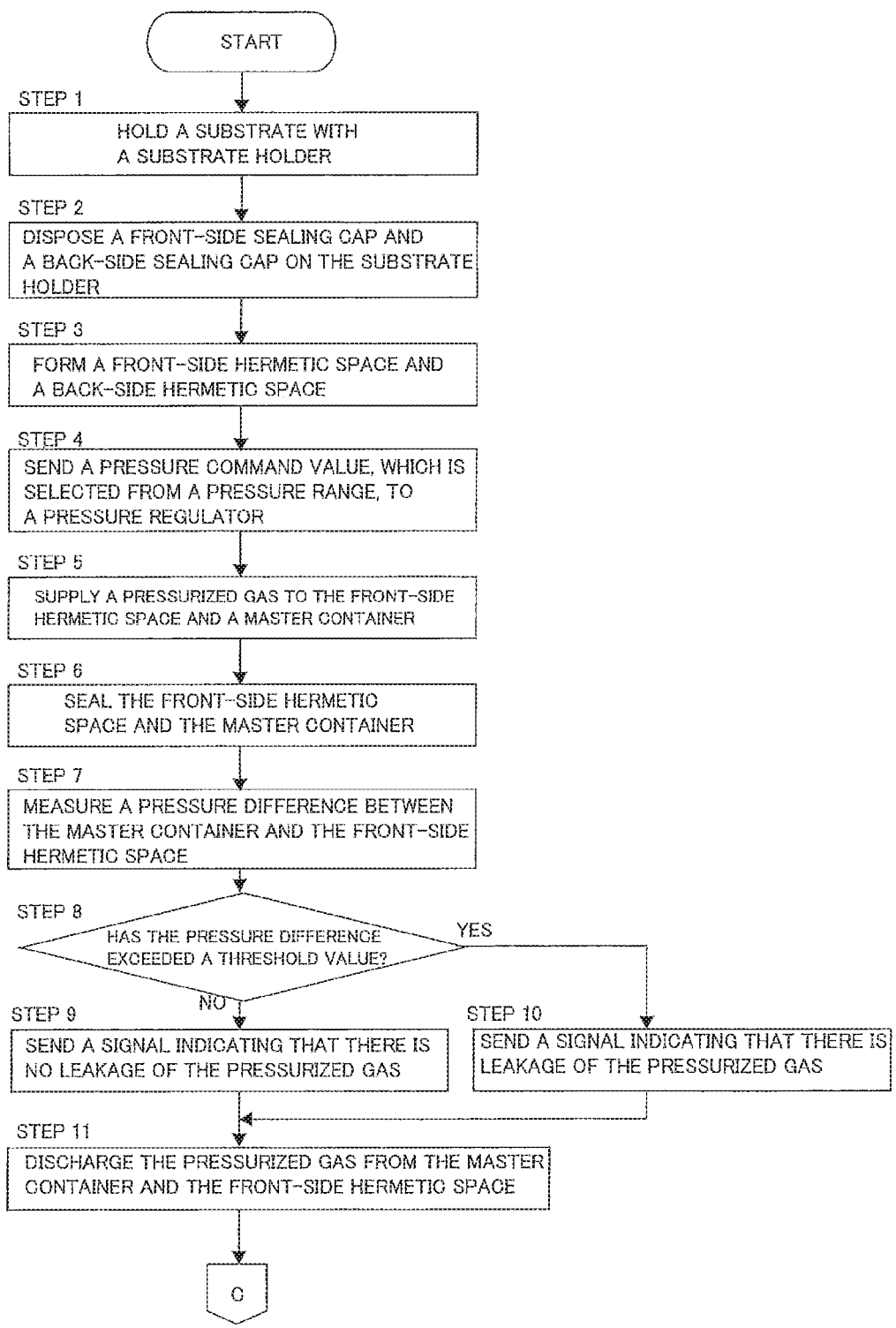
FIG. 20 is a part of a flow chart illustrating an embodiment of a leak checking method performed by using the leak checking apparatus shown in FIG. 16.

FIG. 20 is a flow chart illustrating an embodiment of a leak checking method performed by using the leak checking apparatus 60 shown in FIG. 16. Steps 1 to 4 are the same as the steps 1 to 4 shown in FIG. 17, and a duplicated description thereof is omitted. The operation controller 95 opens the holder-side valve 101, the master-side valve 102 and the front-side branch valve 126 while keeping the first vent valve 103, the second vent valve 104 and the back-side branch valve 129 closed. The pressurized gas flows through the front-side branch line 125 and the differential-pressure check line 75 into the front-side hermetic space S and the master container 80 (step 5). The pressures of the pressurized gas in the front-side hermetic space S and the master container 80 are regulated by the pressure regulator 93, and the operation of the pressure regulator 93 is controlled by the operation controller 95. More specifically, the pressure regulator 93 operates to maintain the pressurized gas in the pressurized-gas introduction line 70 at a pressure corresponding to the pressure command value.

When a predetermined amount of time has elapsed since the holder-side valve 101, the master-side valve 102 and the front-side branch valve 126 were opened, the operation controller 95 closes the holder-side valve 101 and the master-side valve 102. The front-side hermetic space S and the master container 80 are sealed by the holder-side valve 101 and the master-side valve 102. The front-side hermetic space S and the master container 80 are each filled with the pressurized gas having the same pressure (step 6).

While the holder-side valve 101 and the master-side valve 102 are closed, the differential-pressure measuring device 85 measures a pressure difference between the pressurized gas in the master container 80 and the pressurized gas in the front-side hermetic space S (step 7). The differential-pressure measuring device 85 determines whether the pressure difference has exceeded a threshold value within the set time (step 8). If the pressure difference has not exceeded the threshold value within the set time, the differential-pressure measuring device 85 emits a signal indicating that there is no leakage of the pressurized gas in the front-side hermetic space S (i.e. the front-side sealing projection 117 is functioning properly) (step 9). If the pressure difference has exceeded the threshold value within the set time, the differential-pressure measuring device 85 emits a signal indicating that there is leakage of the pressurized gas in the front-side hermetic space S (i.e. there is a failure of the front-side sealing projection 117) (step 10). The operation controller 95 opens the first vent valve 103, the second vent valve 104 and the front-side branch valve 126 to discharge the pressurized gas in the front-side hermetic space S and the pressurized gas in the master container 80 through the holder-side exhaust line 97 and the master-side exhaust line 98 (step 11).

Figure 21:
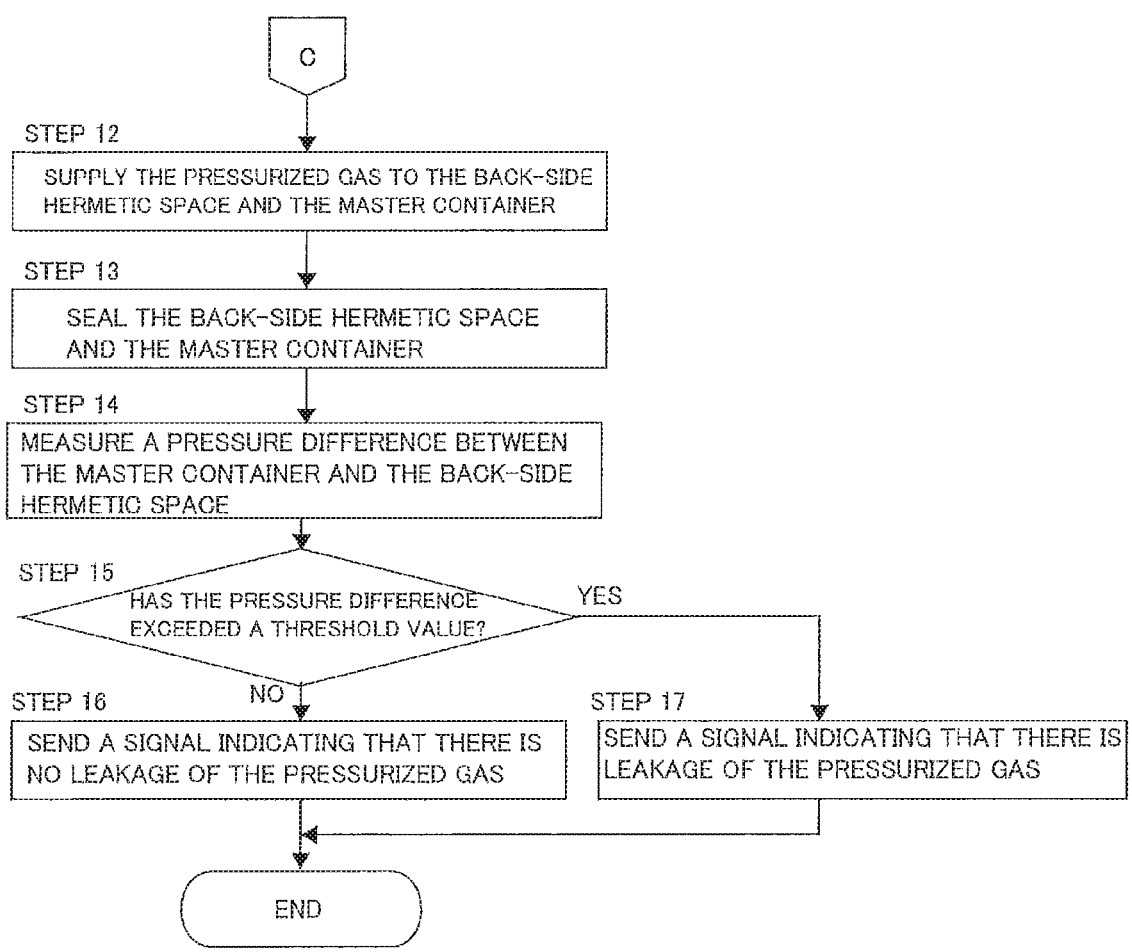
FIG. 21 is other part of the flow chart, following the part shown in FIG. 20.

Next, the operation controller 95 closes the first vent valve 103, the second vent valve 104 and the front-side branch valve 126, and subsequently opens the holder-side valve 101, the master-side valve 102 and the back-side branch valve 129. The pressurized gas flows through the back-side branch line 128 and the differential-pressure check line 75 into the back-side hermetic space U and the master container 80 (step 12 of FIG. 21). The pressures of the pressurized gas in the back-side hermetic space U and the master container 80 are regulated by the pressure regulator 93, and the operation of the pressure regulator 93 is controlled by the operation controller 95. More specifically, the pressure regulator 93 operates to maintain the pressurized gas in the pressurized-gas introduction line 70 at a pressure corresponding to the pressure command value.

When a predetermined amount of time has elapsed since the holder-side valve 101, the master-side valve 102 and the back-side branch valve 129 were opened, the operation controller 95 closes the holder-side valve 101 and the master-side valve 102. The back-side hermetic space U and the master container 80 are sealed by the holder-side valve 101 and the master-side valve 102. The back-side hermetic space U and the master container 80 are each filled with the pressurized gas having the same pressure (step 13).

With the holder-side valve 101 and the master-side valve 102 closed, the differential-pressure measuring device 85 measures a pressure difference between the pressurized gas in the master container 80 and the pressurized gas in the back-side hermetic space U (step 14). The differential-pressure measuring device 85 determines whether the pressure difference has exceeded a threshold value within the set time (step 15). If the pressure difference has not exceeded the threshold value within the set time, the differential-pressure measuring device 85 emits a signal indicating that there is no leakage of the pressurized gas in the back-side hermetic space U (i.e. the back-side sealing projection 49 is functioning properly) (step 16). If the pressure difference has exceeded the threshold value within the set time, the differential-pressure measuring device 85 emits a signal indicating that there is leakage of the pressurized gas in the back-side hermetic space U (i.e. there is a failure of the back-side sealing projection 49) (step 17).

The operation controller 95 opens the first vent valve 103, the second vent valve 104 and the back-side branch valve 129 to discharge the pressurized gas in the back-side hermetic space U and the pressurized gas in the master container 80 through the holder-side exhaust line 97 and the master-side exhaust line 98. The leak check is performed in this manner to test the sealing performances of the front-side sealing projection 117 and the back-side sealing projection 49. In the above-described embodiment, the sealing performance of the front-side sealing projection 117 in contact with the front surface of the substrate W is tested first, and then the sealing performance of the back-side sealing projection 49 in contact with the back surface of the substrate W is tested. In an embodiment, the sealing performance of the back-side sealing projection 49 may be tested first, followed by the test of the sealing performance of the front-side sealing projection 117.

Figure 22:
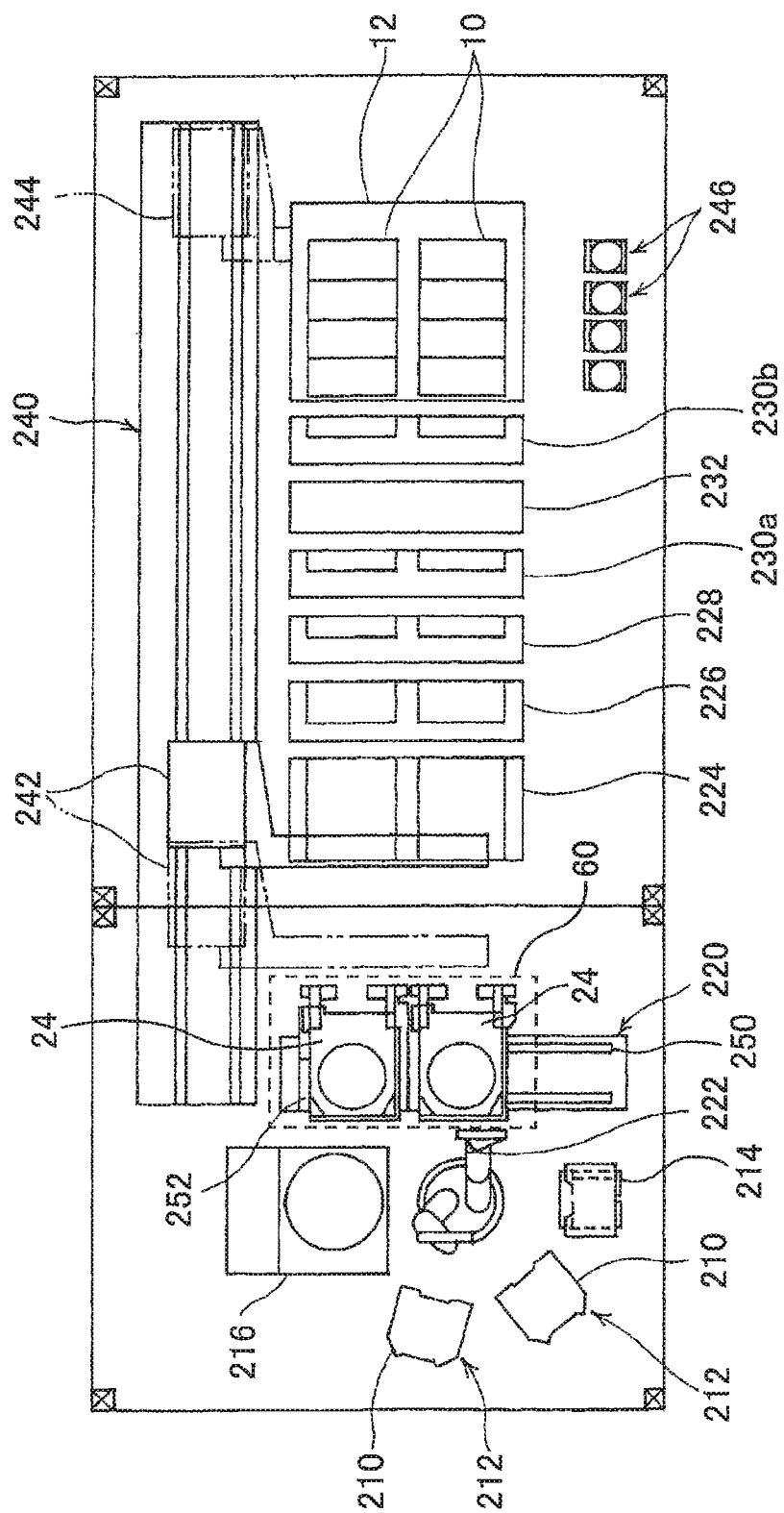
FIG. 22 is an overall layout plan view of an embodiment of an electroplating apparatus.

An embodiment of an electroplating apparatus, including the plating tank 10, the substrate holder 24 and the leak checking apparatus 60 described above, will now be described. FIG. 22 shows an overall layout plan view of the electroplating apparatus. As shown in FIG. 22, the electroplating apparatus includes two cassette tables 212 each for receiving thereon a cassette 210 in which substrates, such wafers, are housed, an aligner 214 for aligning an orientation flat or a notch of a substrate in a predetermined direction, and a spin-rinse drier 216 for drying a plated substrate by rotating it at a high speed. The electroplating apparatus further includes a substrate attachment and detachment section 220 for setting a substrate on a substrate holder 24 and taking the substrate out of the substrate holder 24. In the electroplating apparatus is disposed a substrate transport device 222, comprised of a transport robot, for transporting a substrate between the cassette table 212, the aligner 214, the spin-rinse drier 216 and the substrate attachment and detachment section 220. The electroplating apparatus is provided with the operation controller 95 (not shown in FIG. 22) which is capable of controlling not only the leak checking apparatus 60 but the entire electroplating apparatus.

The electroplating apparatus further includes a stocker 224 for storing and temporarily placing substrate holders 24 therein, a pre-wetting tank 226 for immersing a substrate in pure water, a pre-soaking tank 228 for etching away a surface oxide film, e.g. on a surface seed layer of the substrate, a first water-cleaning tank 230a for cleaning the substrate after pre-soaking, a blow tank 232 for draining the cleaned substrate dry, a second water-cleaning tank 230b for cleaning the plated substrate, and a plurality of plating tanks 10, all of which are arranged in this order. The plating tanks 10 are surrounded by an overflow tank 12. A paddle drive device 246 for driving the paddle 32 (see FIG. 1) is disposed adjacent to the overflow tank 12.

Further, the electroplating apparatus includes a substrate-holder transport device 240 for transporting a substrate holder 24 together with a substrate. The substrate-holder transport device 240 has a first transporter 242 for transporting a substrate between the substrate attachment and detachment section 220 and the stocker 224, and a second transporter 244 for transporting the substrate between the stocker 224, the pre-wetting tank 226, the pre-soaking tank 228, the water-cleaning tanks 230a, 230b, the blow tank 232 and the plating tank 10. The substrate-holder transport device 240 may be provided with only the first transporter 242 without being provided with the second transporter 244.

The substrate attachment and detachment section 220 includes a flat stage plate 252 which is laterally slidable along rails 250. Two substrate holders 24 are placed in a horizontal position and in parallel on the stage plate 252. After transferring a substrate between one substrate holder 24 and the substrate transport device 222, the stage plate 252 is slid laterally, and a substrate is then transferred between the other substrate holder 24 and the substrate transport device 222.

A sequence of plating performed by the thus-constructed plating apparatus will now be described. First, one substrate is taken by the substrate transport device 222 out of the cassette 210 mounted on the cassette table 212, and the substrate is placed on the aligner 214, which aligns an orientation flat or a notch of the substrate in a predetermined direction. After the alignment, the substrate is transported to the substrate attachment and detachment section 220 by the substrate transport device 222.

Two substrate holders 24, housed in the stocker 224, are simultaneously gripped by the first transporter 242 of the substrate-holder transport device 240, and transported to the substrate attachment and detachment section 220. The substrate holders 24 are lowered in a horizontal position to simultaneously place the two substrate holders 24 on the stage plate 252 of the substrate attachment and detachment section 220.

The substrate is transported by the substrate transport device 222 to one substrate holder 24 on the stage plate 252, and is placed, with its to-be-plated surface facing upward, on the substrate support surface 38a (see FIG. 2) of the first holding member 38 of the substrate holder 24. The substrate is set on the substrate holder 24 by the substrate attachment and detachment section 220. More specifically, the substrate attachment and detachment section 220 operates the coupling mechanism 41 (see FIG. 2) to secure the second holding member 40 of the substrate holder 24 to the first holding member 38. The substrate, with the to-be-plated surface exposed through the opening 40a (see FIG. 2) of the substrate holder 24, is held by the substrate holder 24. After completion of the loading of the substrate to the one substrate holder 24, the stage plate 252 is slid laterally, and another substrate is set on the other substrate holder 24 in the same manner. Thereafter, the stage plate 252 is returned to its original position.

Though not shown diagrammatically, instead of the substrate attachment and detachment section 220 on which two substrate holders 24 are to be placed in a horizontal position, it is possible to provide a fixing station which supports two substrate holders 24, which have been transported by the first transporter 242, in a vertical position (or at an angle slightly inclined from the vertical). The substrate holders 24 can be brought into a horizontal position by rotating the fixing station, holding the substrate holders 24 in a vertical position, through 90 degrees.

The above-described leak checking apparatus 60 is incorporated in the substrate attachment and detachment section 220. The leak check is performed on a substrate holder 24 holding a substrate. A substrate, held by a substrate holder 24 which has passed the leak check, is subjected to plating. A substrate holder 24 which has failed to pass the leak check is opened, and a substrate is removed from the substrate holder 24 and is returned to the cassette 210 on the cassette table 212. The substrate holder 24 that has failed to pass the leak check is gripped by the first transporter 242 of the substrate-holder transport device 240, and returned to the stocker 224, where the substrate holder 24 remains unused. The substrate holder 24 is taken out of the stocker 224 e.g. after completion of the operation, and subjected to an appropriate treatment.

A plating process for a substrate, held by a substrate holder 24 which has passed the leak check, will now be described. The substrate holder 24 holding the substrate is transported by the substrate-holder transport device 240 to the pre-wetting tank 226, and is lowered to immerse the substrate, together with the substrate holder 24, in a pre-wetting liquid in the pre-wetting tank 226.

Next, the substrate holder 24 holding the substrate is transported by the substrate-holder transport device 240 to the pre-soaking tank 228. In the pre-soaking tank 228, a surface oxide film of the substrate is etched away, thereby exposing a clean metal surface. Thereafter, the substrate holder 24 holding the substrate is transported by the substrate-holder transport device 240 to the first water-cleaning tank 230a, and the surface of the substrate is cleaned with pure water in the first water-cleaning tank 230a.

The substrate holder 24 holding the cleaned substrate is gripped by the second transporter 244 of the substrate-holder transport device 240 and transported to the plating tank 10, and immersed in a plating solution in the plating tank 10. Plating of the surface of the substrate is performed by applying a voltage between the anode 26 (see FIG. 1) and the substrate while reciprocating the paddle 32 (see FIG. 1) parallel to the surface of the substrate by means of the paddle drive device 246.

After completion of the plating, the application of the voltage and the reciprocation of the paddle 32 are stopped. The substrate holder 24 holding the plated substrate is gripped by the second transporter 244 of the substrate-holder transport device 240 and transported to the second water-cleaning tank 230b, and the surface of the substrate is cleaned with pure water in the second water-cleaning tank 230b.

Next, the substrate holder 24 holding the cleaned substrate is transported by the second transporter 244 of the substrate-holder transport device 240 to the blow tank 232, where water droplets, adhering to the substrate holder 24 and the surface of the substrate, are removed to dryness by blowing of air or N₂ gas. Thereafter, the first transporter 242 of the substrate-holder transport device 240 grips the dried substrate holder 24 and places it on the stage plate 252 of the substrate attachment and detachment section 220.

The substrate attachment and detachment section 220 releases the coupling mechanism 41 of one of the two substrate holders 24 to detach the second holding member 40 from the first holding member 38. The plated substrate is then taken out of the substrate holder 24 by the substrate transport device 222, and transported to the spin rinse drier 216. The spin rinse drier 216 first cleans the substrate with pure water, and then spin-dries the substrate by rotating it at a high speed. The spin-dried substrate is returned by the substrate transport device 222 to the cassette 210.

After or in parallel with returning the substrate, which has been taken out of the one substrate holder 24, to the cassette 210, the stage plate 252 is slid laterally and the substrate is taken out of the other substrate holder 24. The substrate is then spin-dried and returned to the cassette 210 in the same manner.

While the substrate W used in the above-described embodiments is a circular substrate such as a wafer, the present invention can be applied also to a quadrangular substrate. The components of a substrate holder for holding a quadrangular substrate each have a shape that is adapted to the shape of the substrate. For example, the above-described opening 38b may be a quadrangular opening which is smaller than the overall size of the quadrangular substrate. Various sealing elements, such as the second sealing projection 47 and the first sealing projection 48, may each have a shape that is adapted to the shape of the quadrangular substrate. The shapes of other components may also be appropriately modified without departing from the technical concept described herein.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims.

What is claimed is:

1. A leak checking method comprising:
    holding a substrate with a substrate holder, the substrate holder including a first holding member and a second holding member, the first holding member having a first opening and a back-side sealing projection, the second holding member having a second opening and a front-side sealing projection;
    pressing the front-side sealing projection and the back-side sealing projection against a front surface and a back surface, respectively, of the substrate when holding the substrate with the substrate holder;
    covering the front surface of the substrate, exposed through the second opening, and the front-side sealing projection with a front-side sealing cap;
    forming a front-side hermetic space between the front-side sealing cap and the substrate holder;
    covering the back surface of the substrate, exposed through the first opening, and the back-side sealing projection with a back-side sealing cap;
    forming a back-side hermetic space between the back-side sealing cap and the substrate holder;
    introducing a pressurized gas into the front-side hermetic space and/or the back-side hermetic space; and
    detecting a decrease in pressure of the pressurized gas in the front-side hermetic space and/or the back-side hermetic space.

2. The leak checking method according to claim 1, further comprising:
    selecting a pressure command value from a preset pressure range;
    sending the selected pressure command value to a pressure regulator; and
    regulating the pressure of the pressurized gas in the front-side hermetic space and/or the back-side hermetic space with the pressure regulator based on the pressure command value.

3. The leak checking method according to claim 2, wherein the pressure range includes a pressure of a plating solution which is expected to be applied to the front-side sealing projection and the back-side sealing projection when the substrate, held by the substrate holder, is immersed in the plating solution.

4. The leak checking method according to claim 3, wherein a lower limit of the pressure range is a value of a pressure of the plating solution which is expected to be applied to an uppermost portion of the front-side sealing projection or an uppermost portion of the back-side sealing projection when the substrate, held by the substrate holder in a vertical position, is immersed in the plating solution.

5. The leak checking method according to claim 3, wherein an upper limit of the pressure range is a value obtained by multiplying a factor by a value of a pressure of the plating solution which is expected to be applied to a lowermost portion of the front-side sealing projection or a lowermost portion of the back-side sealing projection when the substrate, held by the substrate holder in a vertical position, is immersed in the plating solution.

* * * * *